US 8,975,656 B2

(12) United States Patent
Kim

(10) Patent No.: US 8,975,656 B2
(45) Date of Patent: Mar. 10, 2015

(54) LIGHT EMITTING ELEMENTS, LIGHT EMITTING DEVICES INCLUDING LIGHT EMITTING ELEMENTS AND METHODS OF MANUFACTURING SUCH LIGHT EMITTING ELEMENTS AND/OR DEVICE

(75) Inventor: Yu-Sik Kim, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/611,897

(22) Filed: Sep. 12, 2012

(65) Prior Publication Data

US 2013/0002148 A1   Jan. 3, 2013

Related U.S. Application Data

(63) Continuation of application No. 12/457,176, filed on Jun. 3, 2009, now Pat. No. 8,269,247.

(30) Foreign Application Priority Data

Jun. 13, 2008   (KR) .................. 10-2008-0055995

(51) Int. Cl.
*H01L 33/00*   (2010.01)
*H01L 33/62*   (2010.01)
(Continued)

(52) U.S. Cl.
CPC .............. *H01L 33/62* (2013.01); *H01L 33/20* (2013.01); *H01L 33/46* (2013.01); *H01L 2224/48091* (2013.01); *H01L 2224/73265* (2013.01);
(Continued)

(58) Field of Classification Search
CPC ......... H01L 33/08; H01L 33/10; H01L 33/20; H01L 33/62; H01L 2224/48091

USPC .......... 257/81, 84, 98–99, E33.009, E33.037, 257/E33.065, E33.072–E33.074
See application file for complete search history.

(56) References Cited

U.S. PATENT DOCUMENTS

| 5,481,559 A | 1/1996 | Kawamura |
| 5,748,658 A | 5/1998 | Nakanishi et al. |

(Continued)

FOREIGN PATENT DOCUMENTS

| JP | 52-050196 A | 4/1977 |
| JP | U 57-043496 | 5/1982 |

(Continued)

OTHER PUBLICATIONS

Chinese Office Action dated Oct. 19, 2012.
(Continued)

*Primary Examiner* — Tuyet Thi Vo
*Assistant Examiner* — Henry Luong
(74) *Attorney, Agent, or Firm* — Lee & Morse, P.C.

(57) ABSTRACT

An emitting device includes a first electrode on a base substrate, a second electrode on the base substrate, a third electrode on the base substrate, an emitting structure on and/or at a same level as the first electrode, a first pattern on the base substrate being electrically connected to the first electrode, and a plurality of second patterns on the base substrate, wherein at least one of the second patterns is arranged on a first side of the first pattern and is electrically connected to the second electrode and at least another one of the second patterns is arranged on a second side of the first pattern and is electrically connected to the third electrode, the first side opposing the second side.

19 Claims, 27 Drawing Sheets

(51) Int. Cl.
*H01L 33/20* (2010.01)
*H01L 33/46* (2010.01)

(52) U.S. Cl.
CPC ............... *H01L2924/01066* (2013.01); *H01L 2924/01087* (2013.01); *H01L 2224/32225* (2013.01); *H01L 2224/48227* (2013.01); *H01L 2224/45139* (2013.01)
USPC ............................. 257/99; 315/160; 315/192

(56) References Cited

U.S. PATENT DOCUMENTS

| | | |
|---|---|---|
| 6,897,137 B2 | 5/2005 | Nguyen et al. |
| 7,399,650 B2 | 7/2008 | Kim |
| 7,436,000 B2 | 10/2008 | Kim et al. |
| 7,576,364 B2 | 8/2009 | Lee et al. |
| 7,683,539 B2 | 3/2010 | Kim et al. |
| 7,733,333 B2 | 6/2010 | Kaliher |
| 7,763,899 B2 | 7/2010 | Abe |
| 7,932,970 B2 | 4/2011 | Kim et al. |
| 7,994,771 B2 * | 8/2011 | Sakayori .................... 324/76.11 |
| 8,324,639 B2 | 12/2012 | Fudeta et al. |
| 8,368,846 B2 | 2/2013 | Kim et al. |
| 2002/0084465 A1 | 7/2002 | Green et al. |
| 2003/0059972 A1 * | 3/2003 | Ikeda et al. ...................... 438/47 |
| 2003/0132927 A1 * | 7/2003 | Ouchi et al. .................. 345/204 |
| 2004/0222434 A1 | 11/2004 | Uemura et al. |
| 2005/0057939 A1 | 3/2005 | Mizuyoshi |
| 2005/0077531 A1 | 4/2005 | Kim |
| 2005/0214688 A1 | 9/2005 | Yamamoto et al. |
| 2006/0102915 A1 | 5/2006 | Kim |
| 2006/0163596 A1 | 7/2006 | Kim et al. |
| 2006/0180820 A1 * | 8/2006 | Illek et al. ........................ 257/95 |
| 2006/0202971 A1 | 9/2006 | Kaliher |
| 2006/0226773 A1 * | 10/2006 | Kim et al. ...................... 313/512 |
| 2006/0238326 A1 | 10/2006 | Repetto et al. |
| 2006/0261292 A1 * | 11/2006 | Kim et al. ...................... 250/551 |
| 2007/0035241 A1 | 2/2007 | Abe |
| 2007/0145396 A1 | 6/2007 | Watanabe et al. |
| 2008/0035949 A1 | 2/2008 | Fudeta et al. |
| 2008/0079352 A1 | 4/2008 | Cok |
| 2008/0087907 A1 * | 4/2008 | Park et al. ........................ 257/98 |
| 2008/0100204 A1 | 5/2008 | Kim |
| 2009/0001400 A1 | 1/2009 | Kim et al. |
| 2009/0272996 A1 * | 11/2009 | Chakraborty .................. 257/98 |
| 2010/0219442 A1 | 9/2010 | Lee |
| 2010/0252841 A1 | 10/2010 | Cok et al. |
| 2010/0283067 A1 | 11/2010 | Murakami et al. |
| 2011/0163343 A1 | 7/2011 | Kim et al. |
| 2013/0001634 A1 | 1/2013 | Fudeta et al. |

FOREIGN PATENT DOCUMENTS

| | | |
|---|---|---|
| JP | 59-119775 A | 7/1984 |
| JP | 62-215289 A | 9/1987 |
| JP | 63-070580 A | 3/1988 |
| JP | 06-005914 A | 1/1994 |
| JP | 07-106631 A | 4/1995 |
| JP | H 11-510968 A | 9/1999 |
| JP | 2000-101194 | 4/2000 |
| JP | 2000-174348 A | 6/2000 |
| JP | 2006-013237 A | 1/2006 |
| JP | 2006-148059 A | 6/2006 |
| JP | 2006-210880 A | 8/2006 |
| JP | 2006-324667 A | 11/2006 |
| JP | 2007-035885 A | 2/2007 |
| JP | 2007-043126 A | 2/2007 |
| JP | 2007-048773 | 2/2007 |
| JP | 2007-081313 A | 3/2007 |
| JP | 2007-142256 | 6/2007 |
| JP | 2007-157853 A | 6/2007 |
| JP | 2007-273602 A | 10/2007 |
| JP | 2008-034315 A | 2/2008 |
| JP | 2008-066704 A | 3/2008 |
| KR | 10-2005-0034936 A | 4/2005 |
| KR | 10-0487757 B1 | 4/2005 |
| KR | 10-2005-00060479 A | 6/2005 |
| KR | 10-0604562 B1 | 7/2006 |
| KR | 10-0652133 B1 | 11/2006 |
| WO | WO 2008/036171 A1 | 3/2008 |

OTHER PUBLICATIONS

Japanese Office Action Dated Dec. 3, 2012 (with English Translation).

Taiwanese Office Action (with English Translation) dated Jan. 24, 2014 for co-pending TW 098119224 (Kim).

* cited by examiner

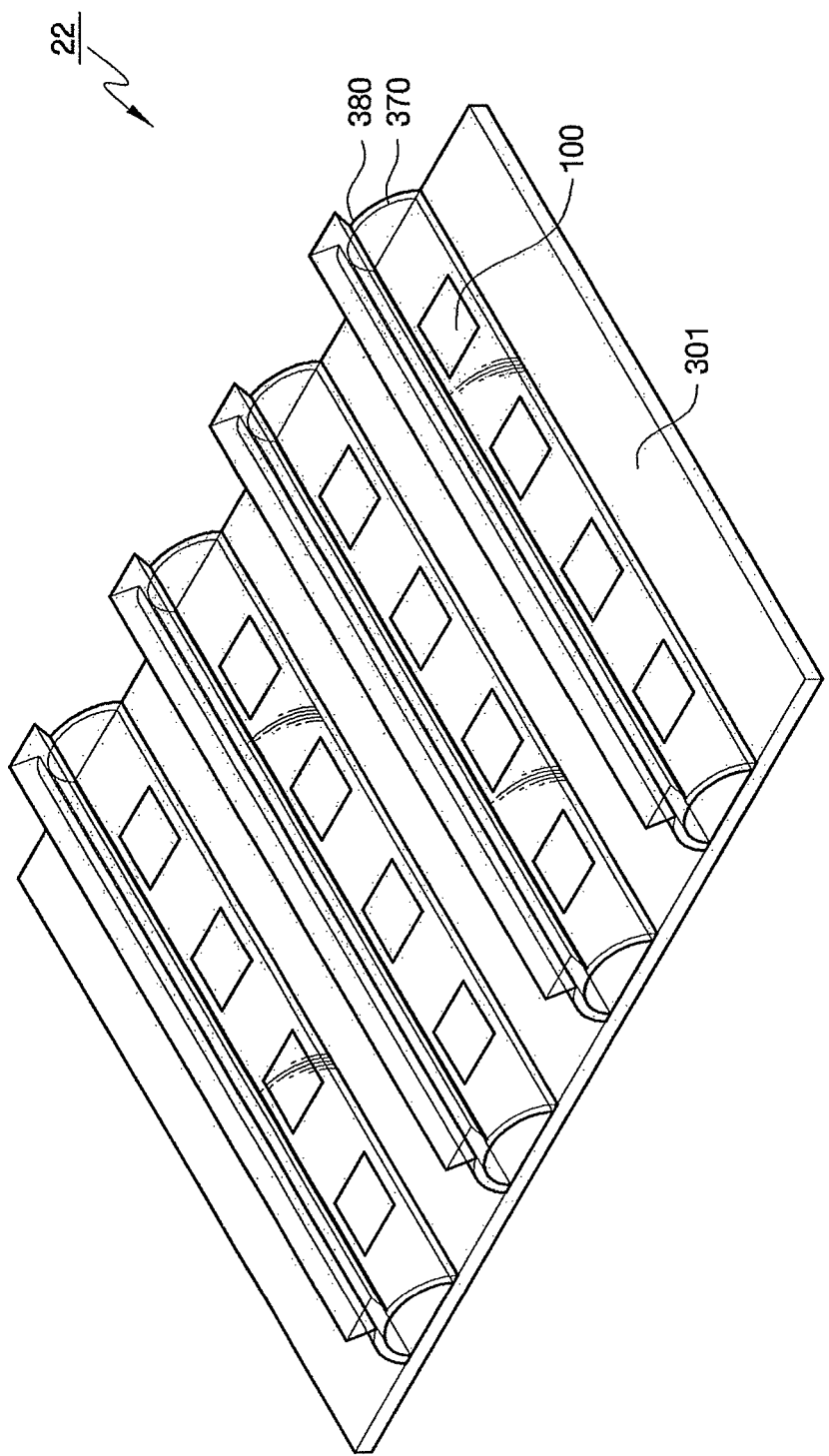

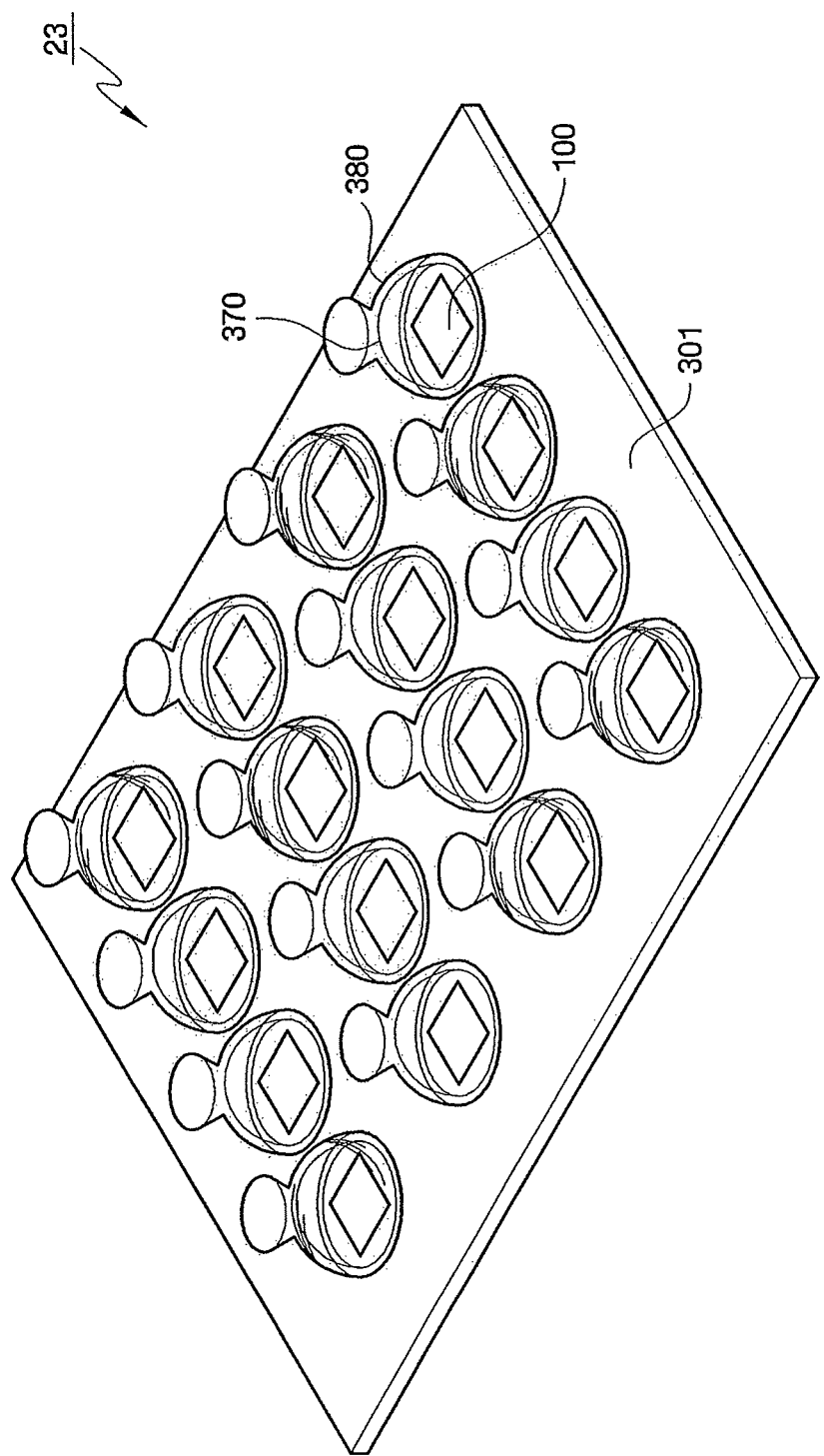

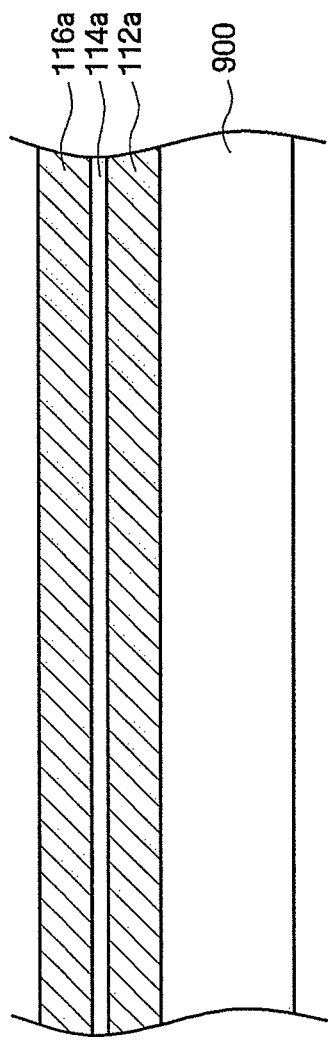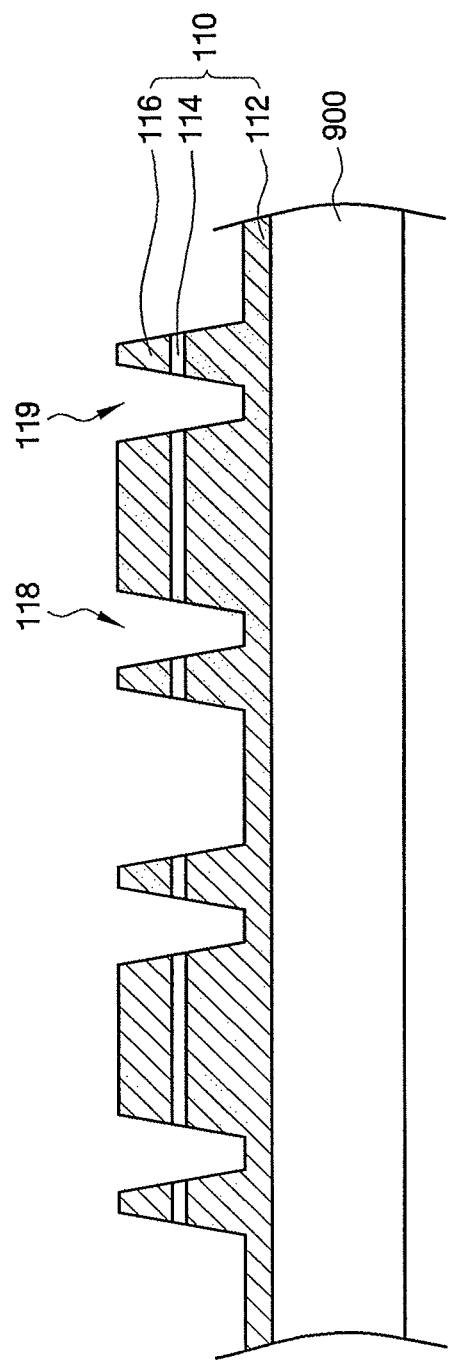

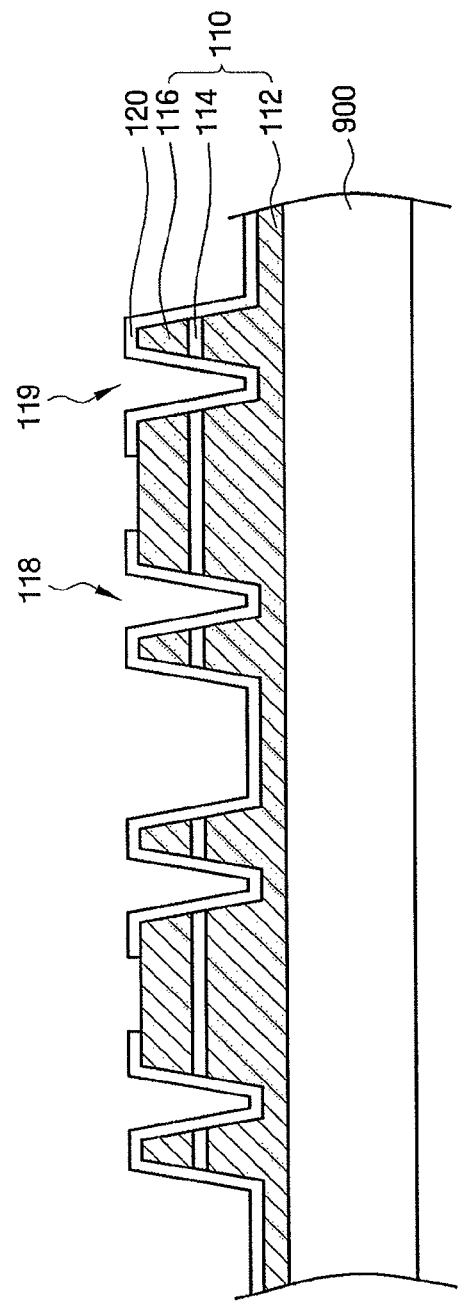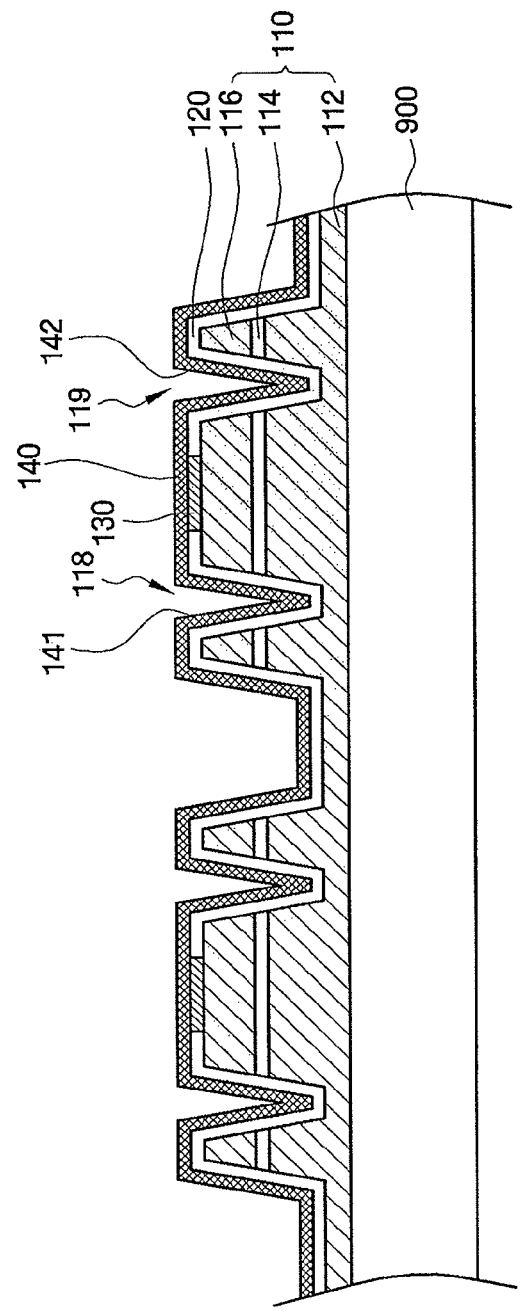

LIGHT EMITTING ELEMENTS, LIGHT EMITTING DEVICES INCLUDING LIGHT EMITTING ELEMENTS AND METHODS OF MANUFACTURING SUCH LIGHT EMITTING ELEMENTS AND/OR DEVICE

CROSS REFERENCE TO RELATED APPLICATION

This is a continuation application based on pending application Ser. No. 12/457,176, filed Jun. 3, 2009, the entire contents of which is hereby incorporated by reference.

BACKGROUND

1. Field

Embodiments relate to light emitting elements, light emitting devices including such light emitting elements, and methods of manufacturing such light emitting elements and/or devices. More particularly, embodiments relate to light emitting devices including light emitting elements adapted for local dimming and/or improved light efficiency. Light emitting devices may include light emitting elements that are individually accessible and/or have improved light efficiency as compared to conventional elements and/or devices. Embodiments also relate to methods of manufacturing such light emitting elements and/or devices.

2. Description of the Related Art

Light emitting elements, e.g., light emitting diodes (LEDs), are employed in a variety of applications, e.g., displays, digital clocks, remote controls, watches, calculators, cell phones, indicator lights, backlights, etc.

LEDs generally emit light as a result of electroluminescence, i.e., recombination of electron-hole pairs. Electron-hole pairs may be recombined as a result of electric current at a semiconductor p-n junction. When electrons and holes recombine, energy may be given off in the form of photons.

While LEDs are already being used in a wide variety of applications, there is a need for improved light emitting elements, e.g., LEDs, having improved light efficiency.

SUMMARY

Embodiments are therefore directed to light emitting elements, light emitting devices employing such light emitting elements and methods of fabricating such light emitting elements and/or devices, which substantially overcome one or more of the problems due to the limitations and disadvantages of the related art.

It is therefore a feature of an embodiment to provide an improved light emitting element.

It is therefore a separate feature of an embodiment to provide an improved light emitting device that is individually accessible.

It is therefore a separate feature of an embodiment to provide a light emitting device having improved light efficiency.

It is therefore a separate feature of an embodiment to provide an improved light emitting apparatus including a plurality of light emitting devices that are individually accessible.

It is therefore a separate feature of an embodiment to provide a method of fabricating an improved light emitting device that is individually accessible and/or has improved light efficiency.

It is therefore a separate feature of an embodiment to provide a light emitting device employable by an LCD back light unit adapted for a local dimming operation and/or having improved light efficiency.

At least one of the above and other features and advantages may be realized by providing an emitting device, including a first electrode on a base substrate, a second electrode on the base substrate, a third electrode on the base substrate, an emitting structure on and/or at a same level as the first electrode, a first pattern on the base substrate being electrically connected to the first electrode, and a plurality of second patterns on the base substrate, at least one of the second patterns being arranged on a first side of the first pattern and being electrically connected to the second electrode and at least another one of the second patterns being arranged on a second side of the first pattern and being electrically connected to the third electrode, the first side opposing the second side.

The emitting structure may include a first conductive pattern, an emitting pattern and a second conductive pattern, the first electrode may be electrically connected to the first conductive pattern, the second electrode may be electrically connected to the second conductive pattern and the third electrode may be electrically connected to the second conductive pattern.

The first electrode may include a plurality of protrusions defining at least one light emitting region and at least one non-light emitting region, the second electrode and the third electrode may overlap the at least one non-light emitting region.

The emitting structure may include a first conductive pattern, an emitting pattern and a second conductive pattern, and a portion of the first electrode may be at a same level as the emitting pattern relative to the base substrate.

The first electrode may include a first portion extending substantially along a first direction and a second portion extending substantially along a second direction, the first direction crossing the second direction.

The second electrode and the third electrode may be arranged on a same level relative to the base substrate.

The device may include a first ohmic pattern between the emitting structure and the first electrode.

The first pattern and the second pattern may be on a first face of the base substrate, and the device may further include a third pattern and a fourth pattern on a second face of the base substrate, the first pattern may be electrically connected to the third pattern by way of a via extending through the base substrate and the second pattern may be electrically connected to the fourth pattern by way of a via extending through the base substrate.

The first electrode may be arranged on a conductive substrate, the conductive substrate being electrically connected to the first pattern.

Each of the second electrode and the third electrode may be electrically connected to the corresponding second pattern by way of a wire or a conductive resin.

At least one of the above and other features and advantages may be separately realized by providing an emitting apparatus, including a plurality of light emitting devices, each of the light emitting devices including a first electrode on a base substrate, a second electrode on the base substrate and an emitting structure between the first electrode and the second electrode, a plurality of first patterns spaced apart from each other and extending parallel to each other along a first direction on the base substrate, each of the first patterns being connected to and overlapping the first electrodes of at least two corresponding ones of the light emitting devices, and a plurality of second patterns spaced apart from each other on the base substrate, the second electrodes of the light emitting devices being connected to corresponding ones of the second patterns, the second patterns being arranged in groups, and the second patterns of each of the groups being indirectly electrically connected to each to other and arranged along a second direction crossing the first direction.

The second patterns of each of the groups may be indirectly electrically connected together by way of the light emitting devices connected with the corresponding group of the second patterns, and/or a corresponding one of lower conductive patterns extending along a plane below a surface of the substrate on which the first patterns and the second patterns are arranged, the second patterns being electrically connected to the corresponding one of the lower conductive patterns by way of vias extending through an insulating layer arranged between the first and second patterns and the lower conductive pattern.

The second patterns of each of the groups may be connected together by way of the second electrodes of the light emitting devices of the corresponding group.

Each of the light emitting devices may include a third electrode connected to another of the second patterns of the corresponding group such that the second patterns of each group may be electrically connected by way of electrical connections between corresponding ones of the second patterns and the respective second electrodes, corresponding ones of the second electrodes and third electrodes, and corresponding ones of the third electrodes and corresponding other ones of the second patterns.

The emitting structure may include an emitting pattern, a first conductive pattern and a second conductive pattern, and the second conductive pattern of the light emitting devices may be connected to the second electrode and the third electrode.

The first electrodes, the second electrodes and the third electrodes may overlap the corresponding one of the first patterns.

The first patterns and the second patterns may extend along a same plane parallel to a plane along which the substrate extends.

The light emitting devices may include one of the second patterns on one side thereof and an adjacent one of the second patterns of a same one of the groups on a second side thereof, the first side opposing the second side, and the first patterns may extend between corresponding adjacent ones of the second patterns.

The first electrode may include at least one protrusion defining a light emitting region and a non-light emitting region, the second electrode overlapping the non-light emitting region.

The first electrode may include a reflective material.

At least one of the above and other features and advantages may be separately realized by providing an emitting apparatus, including a plurality of emitting devices on a base substrate, each of the emitting devices including a first electrode, a second electrode, a third electrode, and an emitting structure on the base substrate, a plurality of first patterns spaced apart from each other on the base substrate, the first electrode of each of the emitting devices overlapping and being electrically connected to a corresponding one of the first patterns, a plurality of second patterns spaced apart from each other on the base substrate, each of the light emitting devices being arranged between two corresponding adjacent ones of the second patterns, wherein, for each of the light emitting devices, the second electrode is connected to one of the corresponding adjacent ones of the second patterns and the third electrode is connected to the other of the corresponding adjacent ones of the second patterns.

Each of the first electrodes may include two protruding portions defining a cavity and an upper portion of the cavity may be wider than a lower portion of the cavity.

Each of the first electrodes may include at least one protrusion.

The first electrode may include two protrusions that substantially define a light emitting region and two connecting regions of the light emitting device, the second electrode may overlap one of the connecting regions and the third electrode may overlap another of the connecting regions.

The first patterns may have a striped pattern such that each of the first patterns defines a row and the second patterns are arranged in groups such that the second patterns of each of the groups are aligned to define columns crossing the rows.

The rows may extend along a first direction and the columns may extend along a second direction, the first direction crossing the second direction.

The emitting devices corresponding to each of the groups of second patterns may be aligned along the corresponding columns defined by the corresponding second patterns.

The emitting devices may be arranged in columns that are parallel to and offset relative to the columns defined by the second patterns.

Each of the second electrodes and the third electrodes may include ITO, Cu, Ni, Cr, Au, Ti, Pt, Al, V, W, Mo and/or Ag.

The emitting apparatus may further include a phosphor layer on the light emitting devices, wherein the phosphor layer includes a transparent resin, wherein phosphor is at least one of dispersed within the transparent resin, on the transparent resin and/or between the transparent resin and the light emitting device.

At least one of the above and other features and advantages may be separately realized by providing a method of biasing an emitting device, including a first electrode on a base substrate, a second electrode on the base substrate, a third electrode on the base substrate, an emitting structure including an emitting pattern between a first conductive pattern and a second conductive pattern, a first pattern on the base substrate being electrically connected to the first electrode, a plurality of second patterns on the base substrate, at least one of the second patterns being arranged on a first side of the first pattern and being electrically connected to the second electrode and at least another one of the second patterns being arranged on a second side of the first pattern and being electrically connected to the third electrode, the first side opposing the second side, the method including applying a first bias to the first conductive pattern through the first pattern and the first electrode, and applying a second bias to the second conductive pattern through the second patterns on the first and the second side of the first pattern and the second and the third electrodes.

The first bias and the second bias may be one of current or voltage, and the first bias may be one of positive and negative and the second bias may be the other of positive and negative.

At least one of the above and other features and advantages may be separately realized by providing a method of fabricating an emitting device, including forming an emitting structure including a conductive pattern, an emitting pattern and another conductive pattern on a substrate, patterning the emitting structure to define at least one trench, forming a first electrode substantially and/or completely on a first side of the emitting structure, forming a second electrode substantially and/or completely on a second side of the emitting structure to form an intermediate structure, the first side being different from the second side of the emitting pattern, arranging the intermediate structure on a base substrate including a first pattern and a plurality of second patterns such that the first electrode overlaps and is electrically connected to the first pattern, and electrically connecting the second electrode to a corresponding one of the second patterns by way of a way of a wire or a conductive resin.

The method may further include forming a third electrode on the second side of the emitting structure, and electrically connecting the third electrode to another corresponding one of the second patterns by way of a wire or a conductive resin.

BRIEF DESCRIPTION OF THE DRAWINGS

The above and other features and advantages will become more apparent to those of ordinary skill in the art by describing in detail exemplary embodiments thereof with reference to the attached drawings, in which:

FIGS. 20A and 20B illustrate exemplary arrangements of the phosphor layer and the second transparent resin of FIG. 18;

FIGS. 22A, 22B, 22C, 22D, 22E, 22F, 22G and 22H illustrate stages in an exemplary method for fabricating the exemplary light emitting device of FIG. 1.

DETAILED DESCRIPTION OF EXEMPLARY EMBODIMENTS

Figure 1:
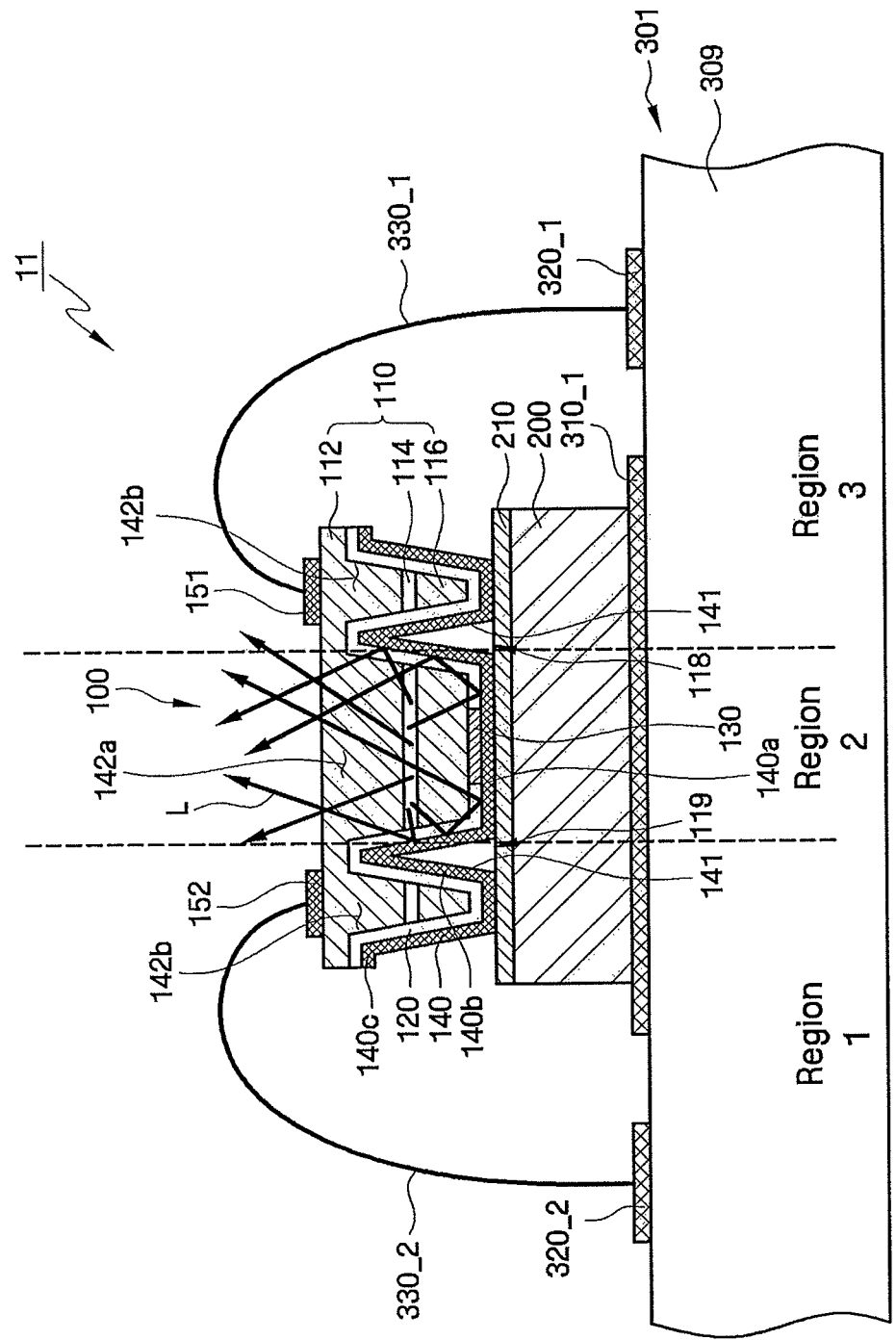
FIG. 1 illustrates a cross-sectional view of a light emitting device according to a first exemplary embodiment employing one or more aspects of the invention.

Korean Patent Application No. 10-2008-0055995, filed on Jun. 13, 2008, in the Korean Intellectual Property Office, and entitled: "LIGHT EMITTING ELEMENT, LIGHT EMITTING DEVICE, AND FABRICATING METHOD OF THE LIGHT EMITTING ELEMENT," is incorporated by reference herein in its entirety.

Embodiments of one or more aspects of the invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when an element is referred to as being "on" another element, it can be directly on the other element, or intervening elements may also be present. Further, it will be understood that when an element is referred to as being "under" another element, it may be directly under, and one or more intervening element may also be present. In addition, it will also be understood that when an element is referred to as being "between" two elements, it may be the only element between the two elements, or one or more intervening elements may also be present. Additionally, it will be understood that when an element is referred to as being "between" two elements, it may be physically arranged between facing/overlapping portions of the two elements, it may be physically arranged such that one of the elements is below it and the other element is above it, or it may be such that it is along a path of, e.g., current flow between the two elements. Like reference numerals refer to like elements throughout the specification.

Exemplary embodiments of light emitting devices employing one or more aspects of the invention will be described below. It should be understood that while the exemplary apparatus may be described employing one of the exemplary light emitting devices described above, embodiments are not limited thereto. Other light emitting devices employing one or more aspects of the invention may be employed.

Figure 2:
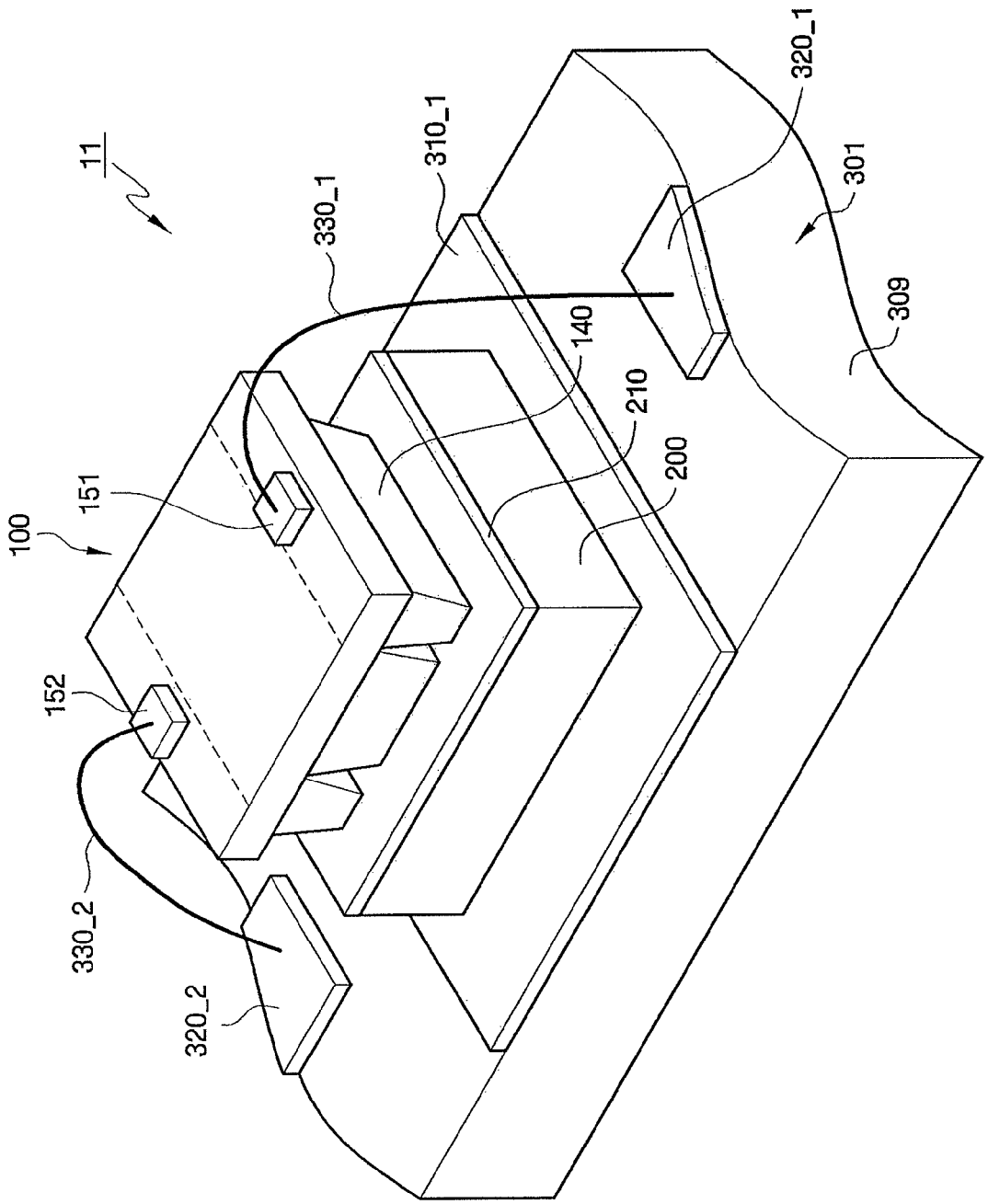
FIG. 2 illustrates a top-side view of the exemplary light emitting device of FIG. 1.
Figure 3:
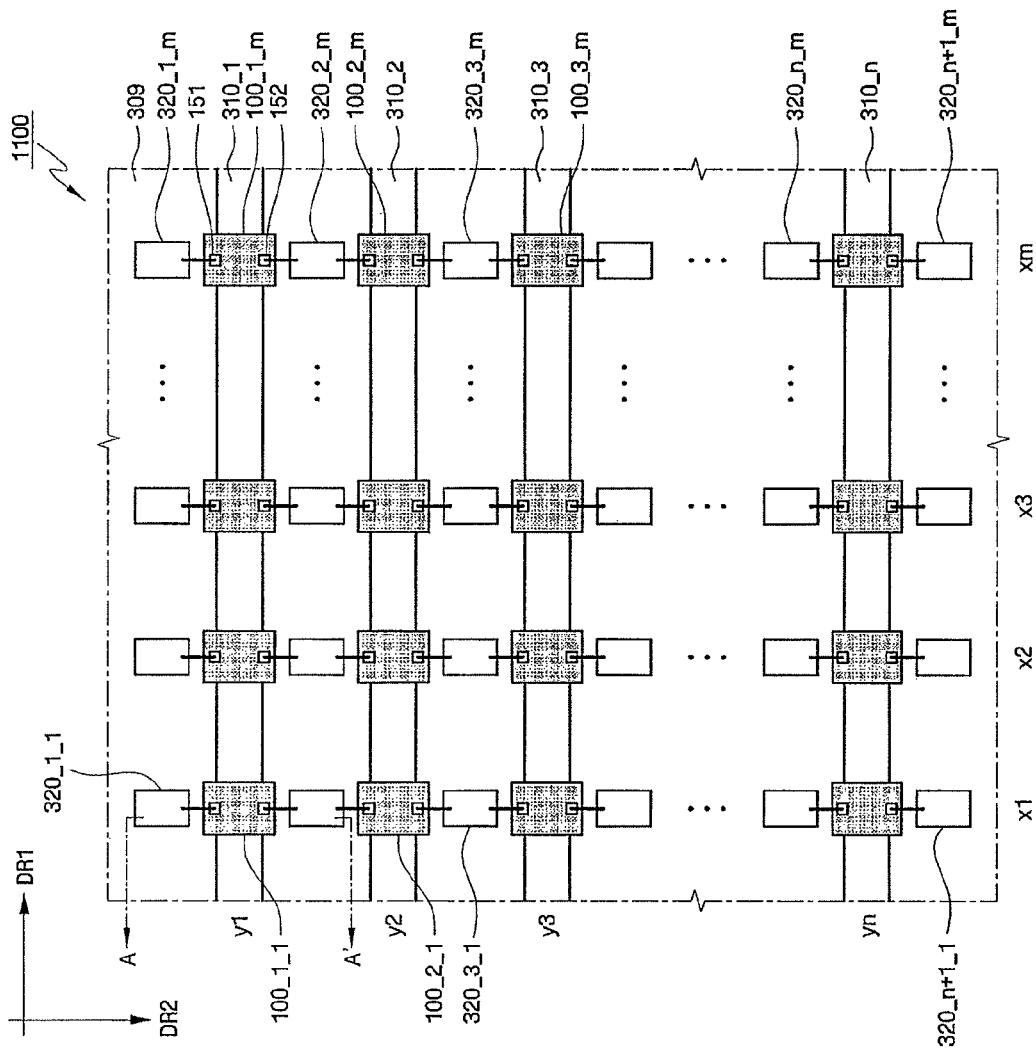
FIG. 3 illustrates a schematic diagram of an exemplary arrangement of a light emitting apparatus including a plurality of the light emitting devices of FIG. 1.

FIG. 1 illustrates a cross-sectional view of a first exemplary embodiment of a light emitting device 11 employing one or more aspects of the invention. FIG. 2 illustrates a top-side view of the light emitting device 11 of FIG. 1. FIG. 3 illustrates an exemplary schematic diagram of an exemplary arrangement of a plurality of the light emitting devices 11 of FIG. 1.

Referring to FIGS. 1 and 2, the light emitting device 11 may include a light emitting element 100 and a circuit board 301. The circuit board 301 may include wires 330_1, 330_2, first pattern 310_1 and second patterns 320_1, 320_2 and a base substrate 309. The light emitting element 100 may include an emitting structure 110, a first electrode 140, a second electrode 151, a third electrode 152, a first ohmic layer 130, an insulation layer 120, a conductive substrate 200 and an intermediate layer 210. The emitting structure 110 may include a first conductive pattern 112, an emitting pattern 114, and a second conductive pattern 116.

Referring to FIG. 1, the wire 330_1 may electrically connect the second electrode 151 to the second pattern 320_1. The wire 330_2 may electrically connect the third electrode 152 to the second pattern 320_2. The conductive substrate 200 may be electrically connected to the first pattern 310_1 by, e.g., a conductive resin (not shown) therebetween. In such cases, e.g., the first electrode 140 may be electrically connected to the first pattern 310_1 by way of the intermediate layer 210, the conductive substrate 200 and the conductive resin.

Referring to FIG. 3, the light emitting apparatus 1100 may include a plurality of the light emitting elements 100 electrically connected to respective portions of the first patterns 310_1 to 310_n and the second patterns 320_1 to 320_n+1. For example, in some embodiments, n×m light emitting elements 100 may be arranged in a matrix-like manner. The first patterns 310_1 to 310_n and/or the second patterns 320_1 to 320_n+1 may be formed on the base substrate 309.

As shown in FIG. 3, in some embodiments, each of the emitting elements 100 may be electrically connected with a respective first pattern 310_1 to 310_n+1 and a respective second pattern 320_1_1 to 320_n+1_m. More particularly, e.g., as shown in the exemplary embodiment of FIG. 3, each of the light emitting elements 100 may be at least partially overlapping with a respective one of the first patterns 310_1 to 310_n and each of the light emitting elements 100 may be electrically connected with at least one, e.g., two, of the second patterns 320_1_1 to 320_n+1_m.

Each of the first patterns 310_1 to 310_n may be electrically connected to a plurality of light emitting elements 100 of the light emitting apparatus 1100. In embodiments, the respective light emitting elements 100 connected with a respective one of the first patterns 310_1 to 310_n may be connected to each other in parallel. The respective light emitting elements 100 connected to respective ones of the second patterns 320_1_1 to 320_n+1_m may be connected to each other in parallel. Such parallel connection(s) may enable improved individual accessibility during driving of the light emitting elements 100.

In some embodiments, the first patterns 310_1 to 310_n may have a striped-type pattern. In such embodiments, e.g., there may be 1 to n first patterns 310_1 to 310_n extending along a first direction DR1 and defining n rows (y1 to yn). The first patterns 310_1 to 310_n may extend parallel to each other. The first patterns 310_1 to 310_n may extend between respective corresponding portions of the second patterns 320_1_ to 320_n+1_m. For example, the first pattern 310_2 in the second row y2, may be electrically connected to m light emitting elements 100_1 to 100_m.

Each of the second patterns 320_1_1 to 320_n+1_m may be physically separate, e.g., completely spaced apart, from the other second patterns 320_1_1 to 320_n+1_n. Each of the second patterns 320_1_1 to 320_n+1_m may be conductive patterns. The second patterns 320_1 to 320_n+1 may be arranged in groups, e.g., columns 1 to m, corresponding to an arrangement of the light emitting elements 100 of the light emitting apparatus 1100. Each of the second patterns, e.g., 320_1_1 to 320_n+1_m may have, e.g., a rounded shape, e.g., circular, or polygonal shape, e.g., a rectangle, square circle, etc.

More particularly, e.g., in embodiments, the second patterns 320_1_1 to 320_n+1_m may define columns x1 to xm extending along a second direction DR2. The first direction D1 may be perpendicular to the second direction D2. Respective portions 1 to m of the ones of the second patterns 320_1_1 to 320_n+1_m arranged between a plurality, e.g., two, of the first patterns, e.g., between 310_1 and 310_2, may be connected to a plurality, e.g., two, of the light emitting elements 100. Further, the light emitting elements 100 may each be connected to one or more respective adjacent ones of the second patterns in the corresponding column and the corresponding adjacent rows of the second patterns. For example, in the exemplary n×m matrix of light emitting elements 100, the light emitting element 100_2_m of the second row y2 and the m-th column xm may be connected to the adjacent second patterns 320_2_m and 320_3_m.

In embodiments, each of the second patterns 320 may be independent patterns on the substrate 309, the second patterns 320 arranged along a same column x along the second direction DR2 may be electrically connected indirectly, e.g., by way of the light emitting elements 100 arranged along the respective column x. That is, the second patterns 320 of a respective column x may not be directly connected to each other. In some embodiments, respective ones of the second patterns 320 of a respective column x may be connected together by way of two or more intervening elements, e.g., respective wire 330, respective light emitting element 100.

Referring to FIG. 3, in some embodiments, the second patterns 320 may be arranged on opposing sides of the respective first patterns 310. For example, the second patterns 320_1_1 to 320_2_1 may be arranged on opposing sides the respective first pattern 310_1. The opposing sides may correspond to sides that extend along a same plane, e.g., non-edge sharing sides having one or more other sides therebetween. More particularly, e.g., the light emitting elements 100 of a respective column x1 to xm may be aligned with respective second patterns 320_1_1 to 320_n+1 along, e.g., the second direction DR2.

The base substrate 309 may have, e.g., a polygonal, circular or oval shape. The base substrate 309 may include a printed circuit board (PCB), metal core printed circuit board (MCPCB), epoxy, Si, Si alloy, strained Si, SiC, and/or SiGe, etc.

Referring back to FIG. 1, features of the exemplary light emitting element 100 will be described in more detail below. The intermediate layer 210 may be on the conductive substrate 200. The conductive substrate 200 may include, e.g., Si, strained Si, Si alloy, SOI, SiC, SiGe, SiGeC, Ge, Ge alloy, GaAs, InAs, III-V semiconductor and/or II-VI semiconductor. The intermediate layer 210 may bond the first electrode 140 to the conductive substrate 200. The intermediate layer 210 may include, e.g., Au, Ag, Pt, Ni, Cu, Sn, Al, Pb, Cr, Ti, and/or W.

The first electrode 140 may be on the intermediate layer 210. The first electrode 140 may include, e.g., a reflective material such that at least some of the light L generated at the emitting pattern 114 and emitted onto the first electrode 140 may be reflected away from the first electrode 140. For example, the first electrode 140 may include Ag, Al, etc.

In some embodiments, e.g., the first electrode 140 may include a bottom portion 140a and one or more side portions 140b. The bottom portion 140a may conform to a shape of the intermediate layer 210 and/or the conductive substrate 200, e.g., extends substantially along a plane parallel to the intermediate layer 210. The side portion(s) 140b may extend along a direction(s) that crosses the plane along which the bottom portion 140a of the first electrode 140 extends. For example, referring to FIG. 1, the side portions 140b of the first electrode 140 may generally extend at an angle of greater than 90° relative to the bottom portion 140a such that a distance between facing lower portions, e.g., portions that are relatively closer to the conductive substrate 200, of the respective side portions 140b is less than a distance between facing upper portions, e.g., portions that are relatively further away from the conductive substrate 200, of the respective side portions 140b.

Adjacent or corresponding ones of the side portions 140b may together define protrusion(s) 141 in the first electrode 140 of the light emitting element 100. In some embodiments, the first electrode 140 may include at least one protrusion 141 defining a groove 118 between the first electrode 140 and the conductive substrate 200. The exemplary light emitting element 100 of FIG. 1 illustrates an exemplary embodiment with two protrusions 141 and two grooves 118 and 119. Further, in some embodiments, e.g., the protrusion(s) 141 and/or the side portion(s) 140b of the first electrode 140 may define one or more cavities 142a, 142b. More particularly, e.g., the first electrode 140 may define one or more cavities 142a corresponding to one or more light emitting regions (e.g., $2^{nd}$ region) of the light emitting element 100 and one or more other cavities 142b corresponding to one or more non-light emitting regions (e.g., $1^{st}$ and $3^{rd}$ regions) of the light emitting element 100. Embodiments are not limited thereto as, e.g., one, some or all the plurality of regions of the light emitting element 100 resulting from the cavities, e.g., 142a, 142b, may correspond to light emitting or non-light emitting regions of the light emitting element 100. The protrusion(s) 141 may include, e.g., an inverted substantially-V-like or an inverted substantially-V-like shape.

Further, in some embodiments, a portion(s) 140c of first electrode 140 may extend above a level of the emitting pattern 114. That is, e.g., referring to FIG. 1, at least some of the emitting structure 110 may be arranged within the cavity 142a, e.g., bowl-shaped cavity, defined by the side portions 140b. More particularly, e.g., the portion(s) 140c of the first electrode 140 may be embedded into a portion of the first conductive pattern 112. It should be understood, that in some embodiments, the first electrode 140 may be completely and/or substantially flat, i.e., not include any side portion(s) 140b or protrusions 141.

The first insulation layer 120 may be on the first electrode 140. More particularly, the first ohmic layer 130 may be on a portion of the first electrode 140 within the light emitting region(s) ($2^{nd}$ Region) and not on a portion of the first electrode 140 within the non-light emitting region(s) ($1^{st}$ Region, $3^{rd}$ Region). The insulation layer 120 may include a nitride layer, an oxide layer and/or, more particularly, an oxide-nitride layer, an aluminum-oxide layer and/or an aluminum-nitride layer.

The first ohmic layer 130 may electrically connect the first electrode 140 and the emitting structure 110. The ohmic layer 130 may include, e.g., at least one of ITO (Indium Tin Oxide), Zn, ZnO, Ag, Ti, Al, Au, Ni, $In_2O_3$, $SnO_2$, Cu, W and Pt. The first ohmic layer 130 may at least partially fill openings defined by the pattern(s) of the first insulation layer 120. Referring to FIG. 1, the first ohmic layer 130 and the first insulation layer 120 may together form a layer in the light emitting element 100.

Referring to FIG. 1, the emitting structure 110 may include the first conductive pattern 112, the emitting pattern 114 and the second conductive pattern 116, which may be successively laminated together. The second conductive pattern 116 may be on the first insulation layer 120 and/or the first ohmic pattern 130. The emitting pattern 114 may be on the second conductive pattern 116. The emitting pattern 114 may be at a same and/or higher level than the first electrode 140 and at a lower level than the second electrode 151, 152. The first conductive pattern 112 may be on the emitting pattern 114.

As discussed above, in some embodiments, the first electrode 140 may include side portion(s) 140b and/or protrusion(s) 141. In such embodiments, e.g., a bottom portion of the emitting structure 110 may include a shape that corresponds to such side portion(s) 140b and/or protrusion(s) 141. For example, referring to FIG. 1, the side portion(s) 140b and/or the protrusions 141 may extend between respective portions of the emitting structure 110. More particularly, e.g., the protrusion 141 may extend between a portion of the emitting structure 110 within the cavity(ies) 142a and other portion(s) of the emitting structure 110 within the cavity(ies) 142b. Referring to FIG. 1, the protrusions 141 may extend above a level of the second conductive pattern 116 and the emitting pattern 114 and may extend only partially into the first conductive pattern 112, i.e., to a level below an upper surface of the first conductive pattern 112.

Each of the first conductive pattern 112, the emitting pattern 114 and/or the second conductive pattern 116 may include $In_xAl_yGa_{(1-x-y)}N$, where $0 \leq x \leq 1$ and $0 \leq y \leq 1$. More particularly, e.g., the first conductive pattern 112, the emitting pattern 114 and/or the second conductive pattern 116 may include GaN, e.g., AlGaN, InGaN, etc. In embodiments, the first conductive pattern 112 may be one of n-type or p-type, and the second conductive pattern 116 may be the other of p-type or n-type. The emitting pattern 114 may correspond to a region of the light emitting element 100 that generates light as a result of recombination of carriers of the first and second conductive patterns 112, 116. Further, a surface of the first conductive pattern 112 may be textured to raise light extraction efficiency.

The second electrode 151 and/or the third electrode 152 may be on the first conductive pattern 112. The second electrode 151 and/or the third electrode 152 may be electrically connected with the first conductive pattern 112. The second electrode 151 and/or the third electrode 152 may include, e.g., ITO, Cu, Ni, Cr, Au, Ti, Pt, Al, V, W, Mo and/or Ag. The second electrode 151 and/or the third electrode 152 may be at a level higher than the first electrode 140 and/or the emitting pattern 114. More particularly, the second electrode 151 and/or the third electrode 152 may overlap the cavity(ies) 142b corresponding to the non-light emitting region ($1^{st}$ Region, $3^{rd}$ Region, respectively) and may not overlap the cavity 142a corresponding to the light emitting region ($2^{nd}$ Region). In the exemplary embodiment of FIG. 1 that includes two non-light emitting regions ($1^{st}$ Region, $3^{rd}$ Region), the second electrode 151 overlaps one of the non-light emitting regions ($3^{rd}$ Region) and the third electrode 152 overlaps another of the non-light emitting regions ($1^{st}$ Region). More particularly, e.g., the second electrode 151 and the third electrode 152 may be arranged so as not to block light being emitted from the emitting structure 110. Each of the first electrode 140, the second electrode 151 and the third electrode 152 may be separate from one another.

Referring to FIG. 1, exemplary operation of the light emitting device 11 shown in FIG. 1 will be described below. For example, in some embodiments, the first conductive pattern 112 may be n-type and the second conductive pattern 116 may be p-type. In such embodiments, a first bias, e.g., a positive bias (V+ or I+) may be applied to the second conductive pattern 116 through the first pattern 310_1, the first electrode 140 and the first ohmic pattern 130 and a second bias, e.g., a negative bias (V– or I–) may be applied to the first conductive pattern 112 via the second pattern 320_1 and the second electrode 151 and/or the second pattern 320_2 and the third electrode 152. A forward bias may be applied to the emitting structure 110, and light may be generated at the emitting pattern 114. During forward bias operation, current may flow from the first electrode 140 to the second electrode 151 and the third electrode 152. While forward bias operation is described above, embodiments are not limited to such a forward bias operation. Further, the insulation layer 120 may regulate current. In embodiments in which current may flow through all and/or substantially all regions of the emitting pattern 114, light efficiency may be improved, e.g., higher.

Figure 4:
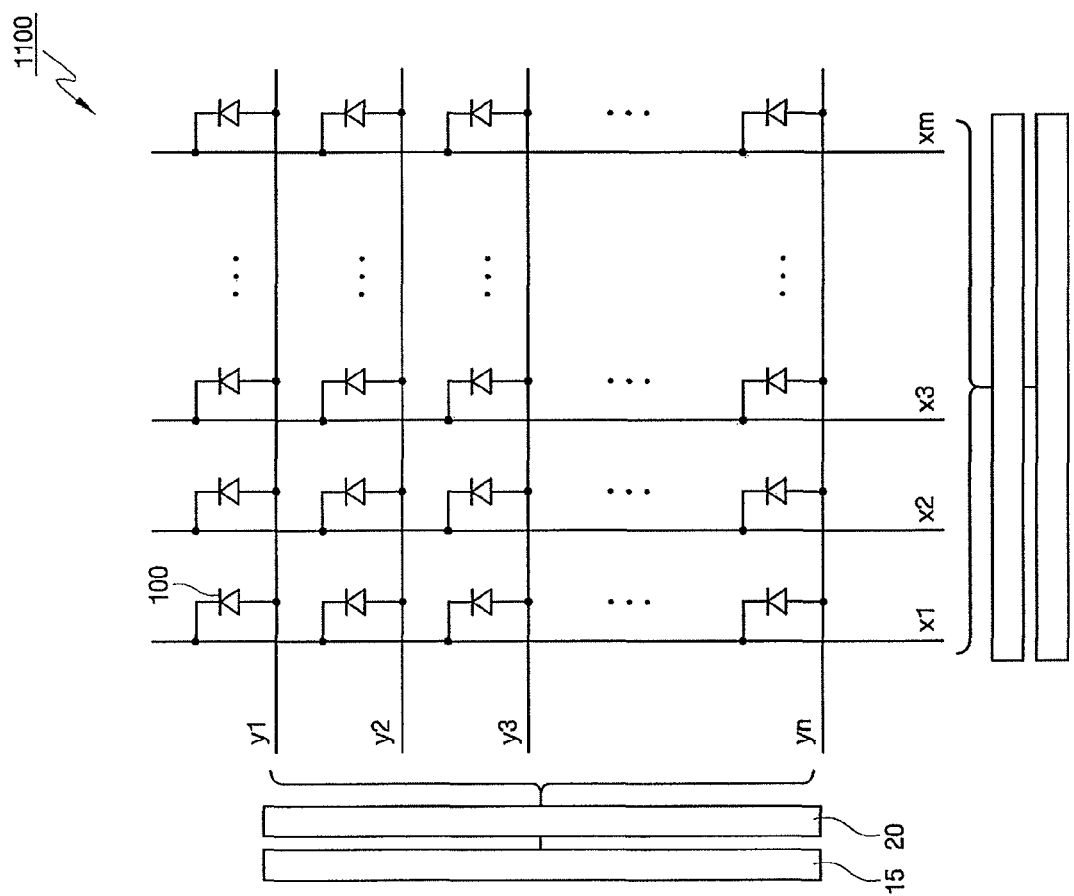
FIG. 4 illustrates an exemplary schematic diagram of the light emitting apparatus of FIG. 3.

FIG. 4 illustrates an exemplary schematic diagram of the light emitting apparatus 1100 of FIG. 3. Referring to FIG. 4, the light emitting apparatus 1100 may include emitting device controller(s) 15 and LED driver integrated circuit (LDI) controller(s) 20. The emitting device controller(s) 15 and the LDI controller(s) 20 may independently drive each of the light emitting elements 100 of the light emitting apparatus 1100. More particularly, e.g., the light emitting elements 100 of the light emitting apparatus 1100 may be connected in parallel. Therefore, by parallel connecting the plurality of light emitting elements 100 within the light emitting apparatus 1100, it may be possible to individually access each of the plurality of light emitting elements 100. Accordingly, such a light emitting apparatus 1100 may be capable of an optimized local dimming operation. Local dimming may improve contrast of an image being displayed.

Figure 5:
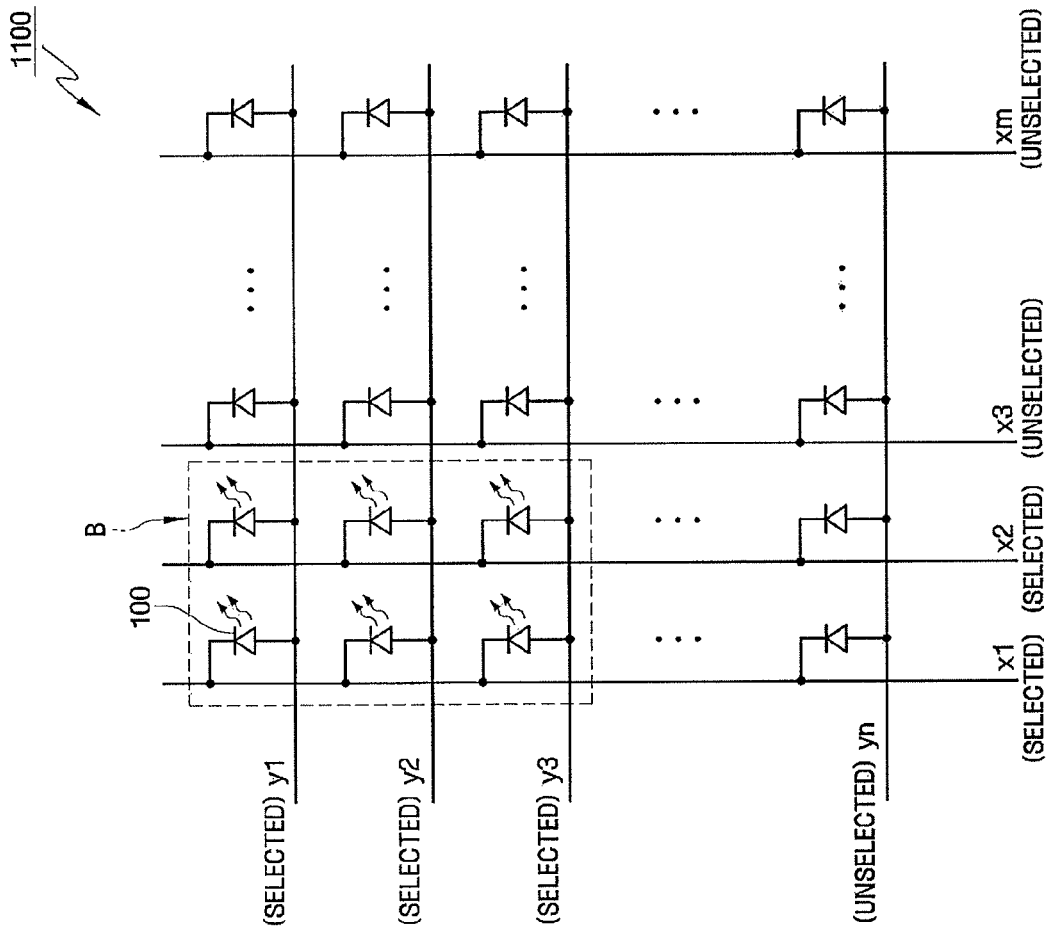
FIG. 5 illustrates an exemplary schematic diagram of the light emitting apparatus of FIG. 3 during an operating state when some of the light emitting devices are selected.

FIG. 5 illustrates an exemplary schematic diagram of the light emitting device 11 of FIG. 1 during an operating state employing local dimming. As shown in FIG. 5, when, e.g., columns x1 and x2 and rows y1, y2 and y3 are selected by the controllers 15, 20 and the other rows x3 to xm and columns y4 to yn are not selected, light may be emitted from the light emitting elements 100 in region B and light may not be emitted from the light emitting elements 100 not in region B. Such selective control of a light emitting state of the light emitting elements 100 may help improve contrast of a display apparatus.

Figure 6:
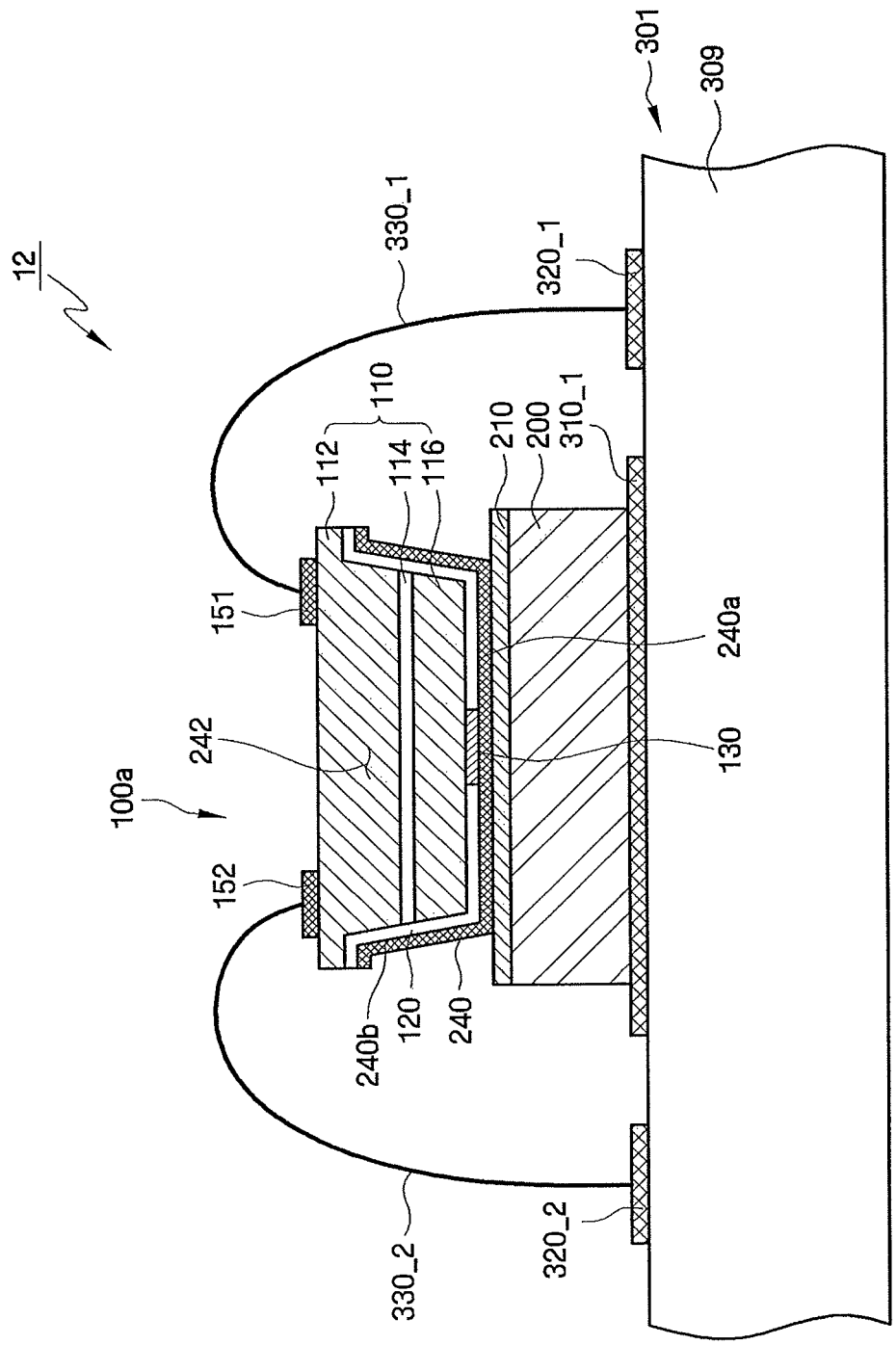
FIG. 6 illustrates a cross-sectional view of a light emitting device according to a second exemplary embodiment employing one or more aspects of the invention.

FIG. 6 illustrates a cross-sectional view of a light emitting device 12 according to a second exemplary embodiment employing one or more aspects of the invention. In general, only differences between the light emitting device 12 and the light emitting device 11 of FIG. 1 will be described below.

Referring to FIG. 6, the light emitting device 12 may include a light emitting device 100*a* including a first electrode 240. The first electrode 240 may include a bottom portion 240*a* and side portion(s) 240*b*. However, in contrast to the first electrode 140 of the exemplary light emitting element 100 of FIG. 1, the first electrode 240 of the exemplary light emitting element 100*a* does not include protrusions 141. The side portions 240*b* of the first electrode 240 of the exemplary light emitting element 100*a* may define a cavity 242. More particularly, the first electrode 240 of the light emitting apparatus 12 may include only one cavity 242. The emitting pattern 114 may be at least partially within the cavity 242. The second electrode 151 and the third electrode 152 may at least partially overlap the cavity 242. More particularly, e.g., the second electrode 151 and the third electrode 152 may arranged so as to substantially overlap the side portions 240*b* of the first electrode 240.

Figure 7:
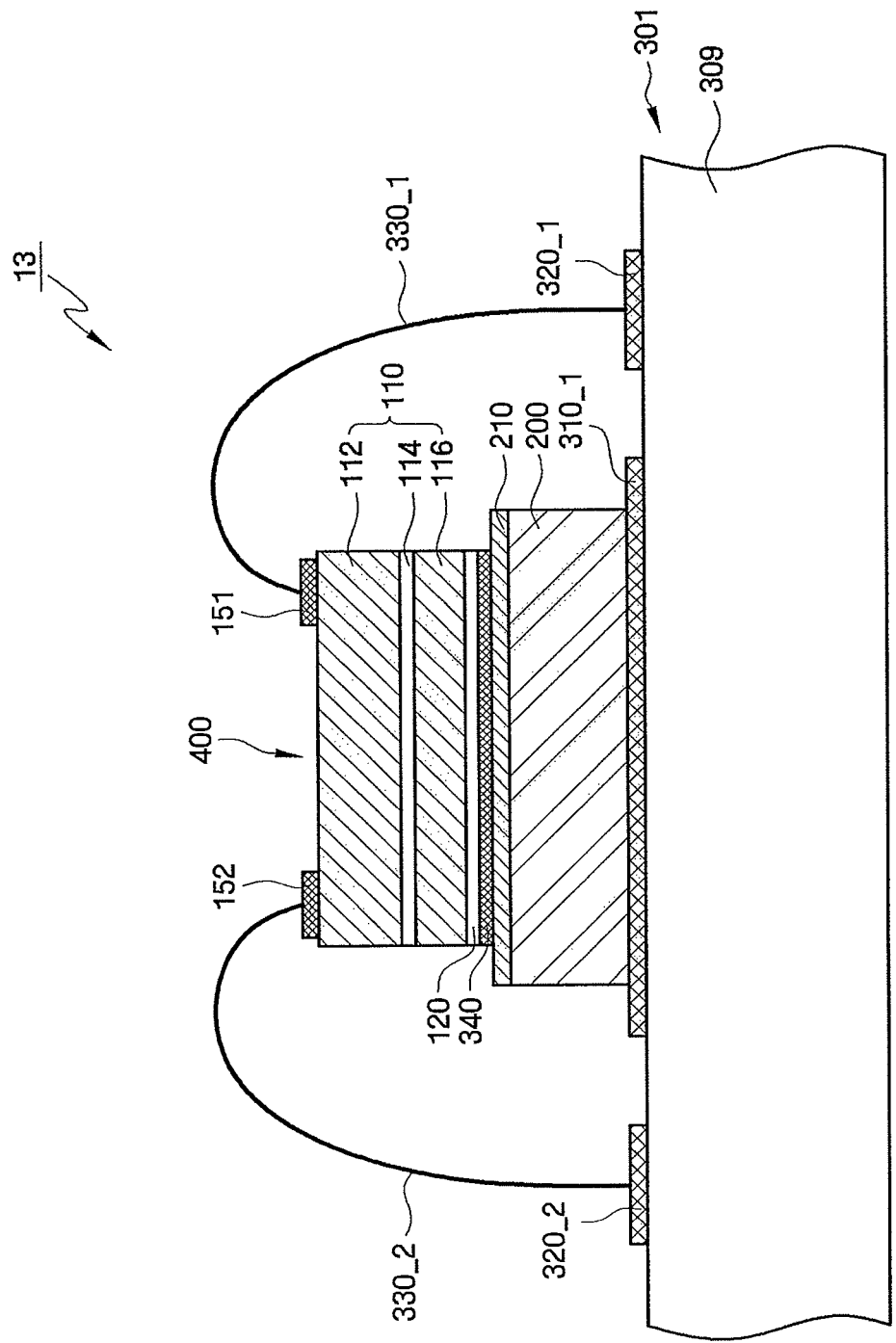
FIG. 7 illustrates a cross-sectional view of a light emitting device according to a third exemplary embodiment employing one or more aspects of the invention.

FIG. 7 illustrates a cross-sectional view of a light emitting device 13 according to a third exemplary embodiment employing one or more aspects of the invention. In general, only differences between the light emitting device 13 and the light emitting device 11 of FIG. 1 will be described below.

Referring to FIG. 7, the light emitting device 13 may include a light emitting device 400 including a first electrode 340. The first electrode 340 may conform to a shape of the intermediate layer 210 and/or a side of the conductive substrate 200 on which it is arranged. For example, if the first electrode 340 is arranged on a side of the conductive substrate 200 that is substantially planar, the first electrode 340 may extend substantially along a plane. In contrast to the first electrode 140 of the light emitting element 100 of FIG. 1, the first electrode 340 of the light emitting device 300 may not include any side portion(s) 140*b* and/or any protrusion(s) 141. Further, the first electrode 340 of the light emitting device 400 may not define any cavities. In the exemplary light emitting element 400, the first electrode 340 is arranged only along a bottom of the emitting structure 110.

Figure 8:
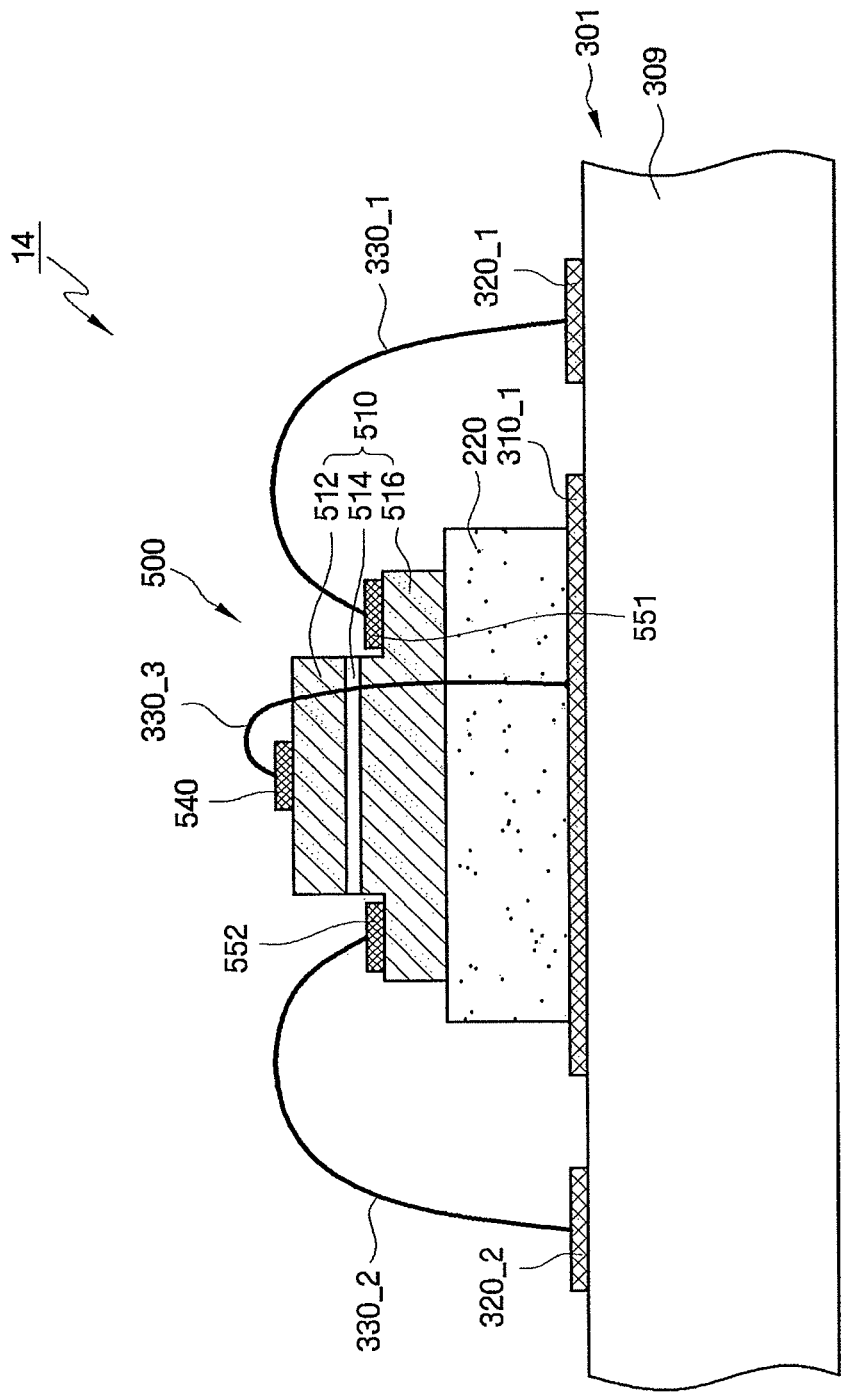
FIG. 8 illustrates a cross-sectional view of a light emitting device according to a fourth exemplary embodiment employing one or more aspects of the invention.

FIG. 8 illustrates a cross-sectional view of a light emitting device 14 according to a fourth exemplary embodiment employing one or more aspects of the invention.

Further, one or more aspects of the invention may be applied to a lateral type light emitting device. Referring to FIG. 8, e.g., the light emitting device 14 may include a lateral type light emitting element 500. The light emitting element 500 may include a first electrode 540, a second electrode 551, a third electrode 552, an emitting structure 510 and a substrate 220. The emitting structure 510 may include an emitting pattern 514 between a first conductive pattern 512 and a second conductive pattern 516. The second conductive pattern 516 may be on, e.g., directly on, the substrate 220. The substrate 220 may include, e.g., Al$_2$O$_3$, ZnO, Si and/or SiC, etc. The first electrode 540 may be on the first conductive pattern 512. The second electrode 551 and the third electrode 552 may be on respective portions of the second conductive pattern 516. The substrate 220 may be arranged on the first pattern 310_1. The first electrode 540 may be connected via a wire 330_3 to the respective first pattern 310_1. The second electrode 551 may be connected via the wire 330_1 to the respective second pattern 320_1 and the third electrode 552 may be connected via the wire 330_2 to the respective second pattern 320_2. The light emitting element 500 may not include an ohmic pattern between the substrate 201 and second conductive pattern 516. As shown in FIG. 8, in such embodiments, the first electrode 540 may be further away from an upper surface of the substrate 220 relative to the second and third electrodes 551, 552. More particularly, e.g., the emitting pattern 514 and the first conductive pattern 512 may be further away from the upper surface of the substrate 220 than a surface(s) of the second conductive pattern 516 on which the second and third electrodes 551, 552 may be respectively arranged.

Figure 9:
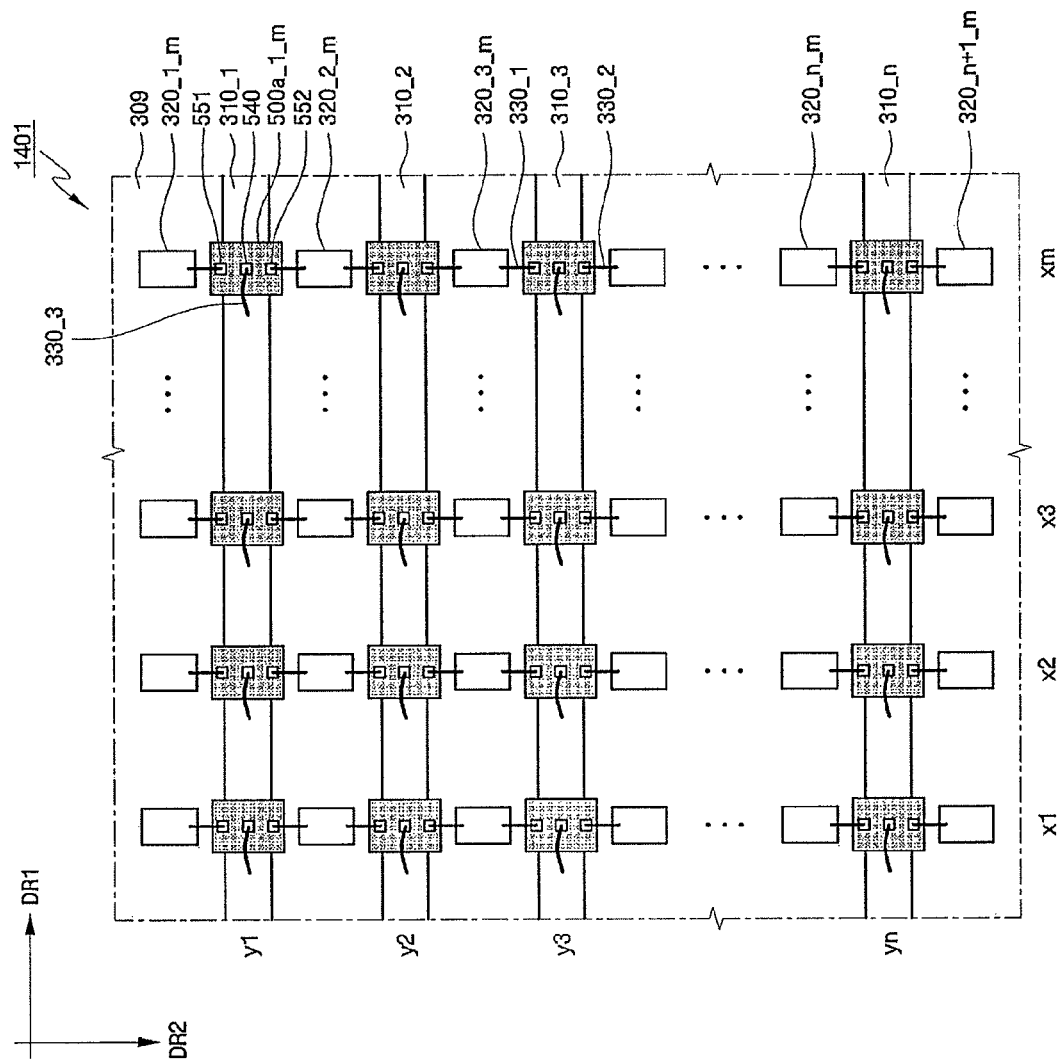
FIG. 9 illustrates a schematic diagram of an exemplary arrangement of a light emitting apparatus including a plurality of the light emitting devices of FIG. 8.
Figure 10:
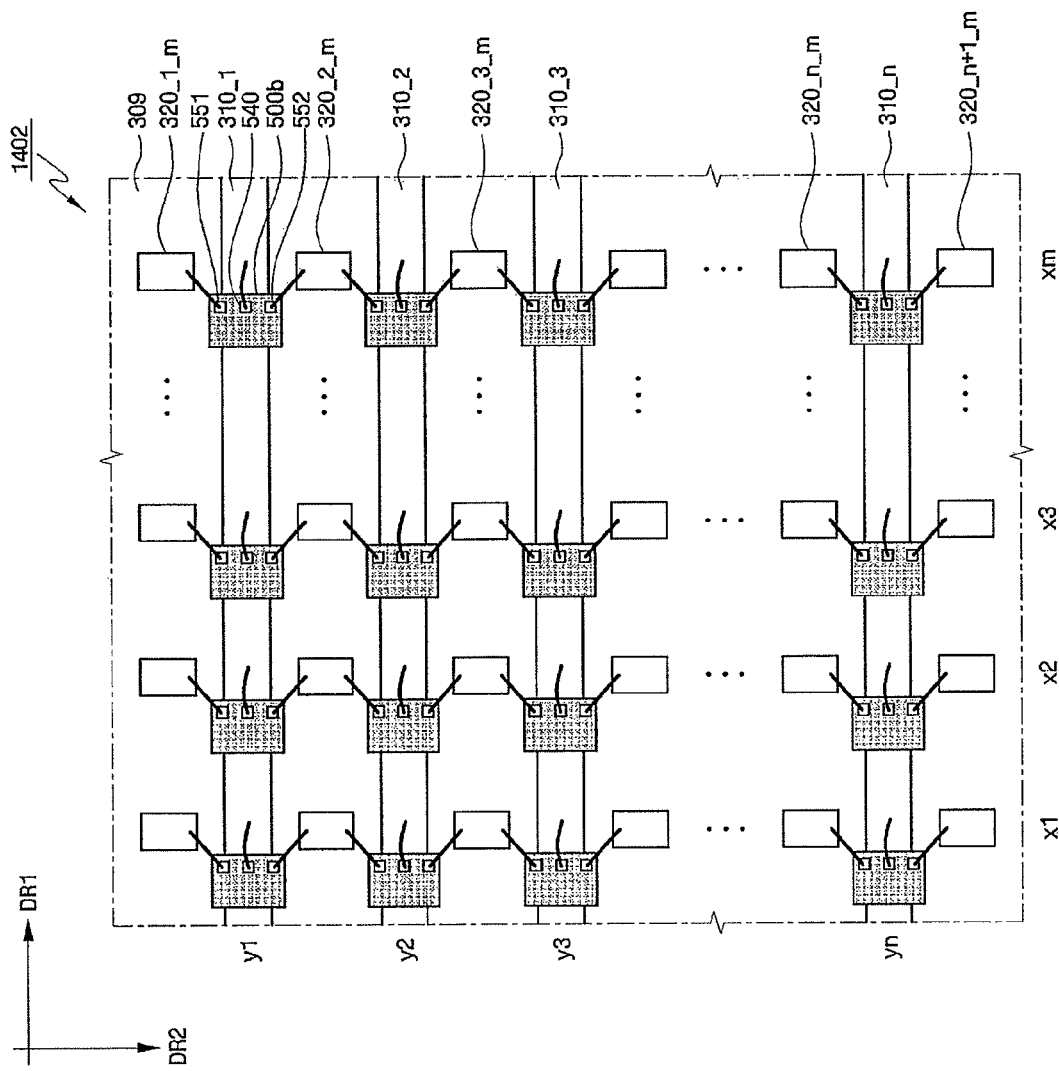
FIG. 10 illustrates a schematic diagram of another arrangement of a light emitting apparatus including a plurality of the light emitting devices of FIG. 8.

FIG. 9 illustrates an exemplary schematic diagram of first and second conductive patterns 310_1 to 310_*n*, 320_1 to 320_*n*+1 and first, second and third electrodes 540, 551, 552 of a light emitting apparatus 1401 employing a plurality of the light emitting devices 14 of FIG. 8. FIG. 10 illustrates another exemplary schematic diagram of first and second conductive patterns 310_1 to 310_*n*, 320_1 to 320_*n*+1 and second and third electrodes 540, 551, 552 of a light emitting apparatus 1402 employing a plurality of the light emitting devices 14 of FIG. 8. In general, only differences between respective light emitting apparatus 1401, 1402 of FIGS. 9 and 10 and the light emitting apparatus 1100 of FIG. 3 will be described below. More particularly, in the exemplary light emitting apparatus 1401, 1402 of FIGS. 9 and 10, the first electrode 540 of the respective light emitting element 500*a*, 500*b* may be electrically connected to the respective first pattern 310_1 via the respective wire 330_3.

Figure 14:
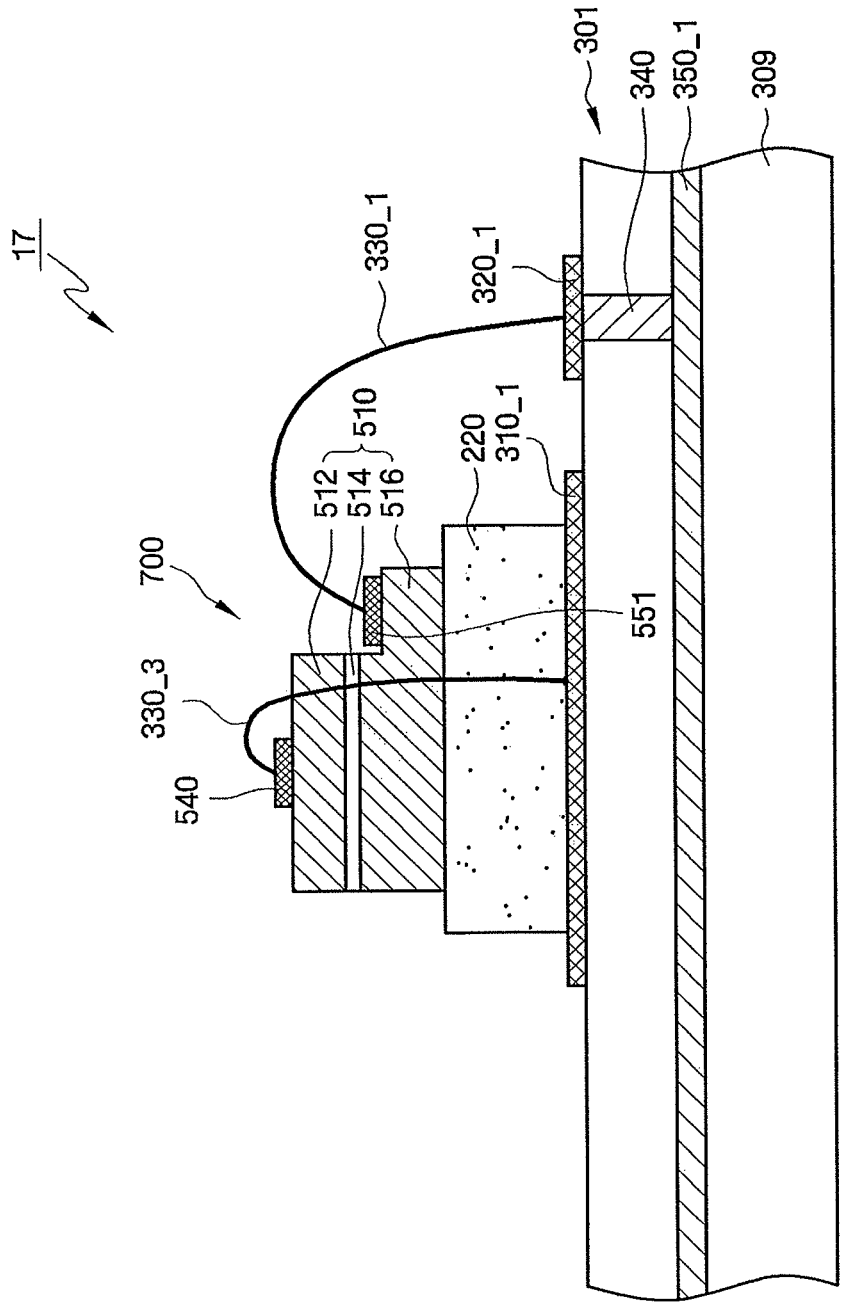
FIG. 14 illustrates a cross-sectional view of a light emitting device according to a seventh exemplary embodiment employing one or more aspects of the invention.

Referring to FIG. 9, other than employing the light emitting elements 500 of FIG. 14 instead of the light emitting elements 100 of FIG. 1, the light emitting apparatus 1401 substantially corresponds to the light emitting apparatus 11 of FIG. 3. More particularly, the light emitting apparatus 14*a* of FIG. 9, may include a plurality of light emitting elements 500*a* arranged similarly to the light emitting elements 100 of FIG. 3 on the base substrate 309. The first electrode 540 of each of the light emitting elements 500*a* may be electrically connected to the respective first pattern 310_1 to 310_*n* via the respective wire 330_3, the second electrode 551 of each of the light emitting elements 500*a* may be electrically connected to the respective portion of the respective second pattern 320_1 to 320_*n*+1 via the wire 330_1 and the third electrode 552 of each of the light emitting elements 500*a* may be electrically connected to the respective portion of the respective second pattern 320_1_1 to 320_*n*+1_*m*. Referring to FIG. 9, e.g., each of the light emitting elements 500*a* may be arranged between corresponding adjacent ones the second patterns 320_1_1 to 320_*n*+1_m, e.g., the light emitting element 500*a*_1_*m* may be arranged between the second patterns 320_1_*m* and 320_2_*m* corresponding to the adjacent rows y1 and y2 and the respective mth column with which the respective light emitting element 500*a*_1_*m* is associated.

Referring to FIG. 10, other than the arrangement of light emitting elements 500*b* relative to the second patterns 320_1 to 320_*n*+1 on the base substrate 309, the light emitting apparatus 1402 substantially corresponds to the light emitting apparatus 1401 of FIG. 9. In the exemplary apparatus 1100, 1401 of FIGS. 3 and 9, the respective light emitting elements 100, 500*a* may be arranged so as to be completely and/or substantially aligned with the respective second patterns 320_1_1 to 320_*n*+1_*m* such that the respective second patterns 320_1_1 to 320_*n*+1_*m* and the respective light emitting elements 100, 500*a* together define the respective columns x1 to xm. In the exemplary apparatus 1402 of FIG. 10, the respective light emitting elements 500*b* are arranged so as to be offset from the respective second patterns 320_1 to 320_*n*+1. That is, the respective light emitting elements 500*b* may be partially and/or completely offset relative to the respective second patterns 320_1_1 to 320_*n*+1_*m*. For example, the light emitting elements 500*b* may be arranged such that each light emitting element 500*b* and corresponding respective second patterns 320_1_1 to 320_*n*+1_*m* define a triangle. Even with such an arrangement, respective ones of the light emitting elements 500*b* and the corresponding respective ones of the second patterns 320_1_1 to 320_*n*+1_*m* may define respective columns x1 to xm. It should be understood that while this alternative exemplary arrangement of the light emitting elements 500*b* is illustrated, other embodiments, e.g., light emitting element 100 of FIG. 3, may also employ such an arrangement. Further, it should be understood that embodiments may also employ other arrangements.

Figure 11:
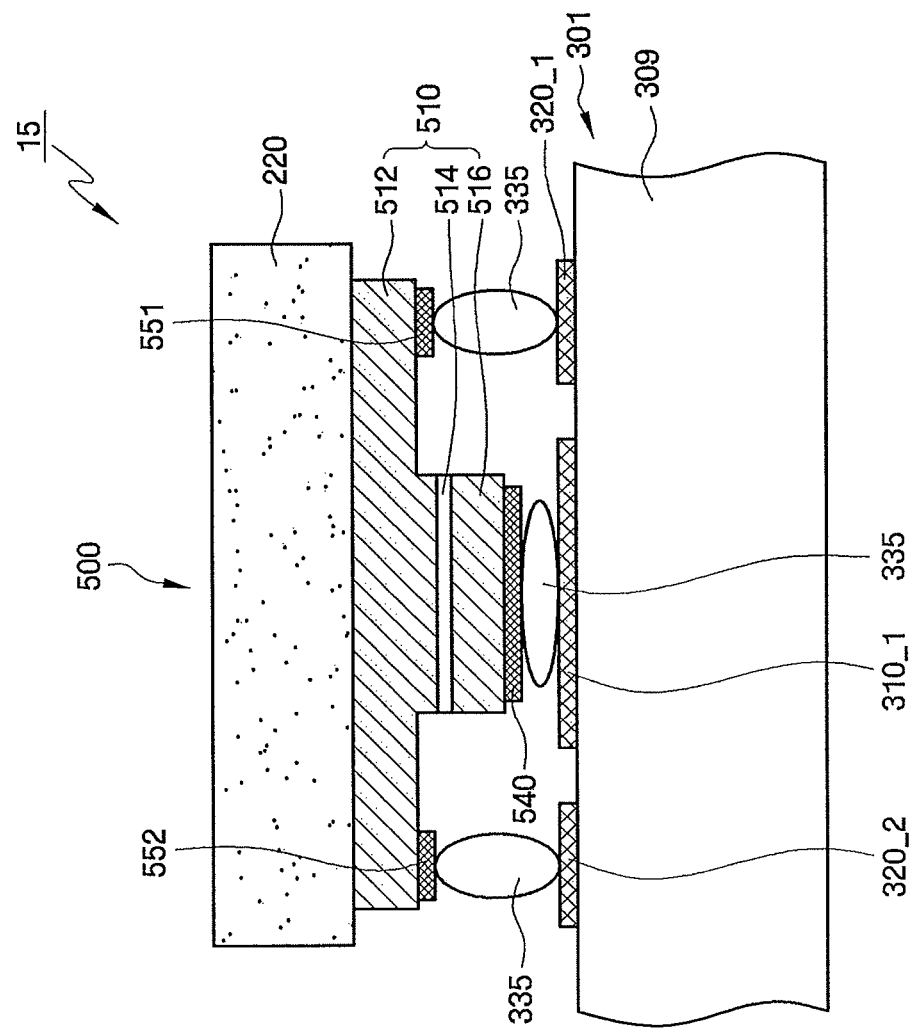
FIG. 11 illustrates a cross-sectional view of a light emitting device according to a fifth exemplary embodiment employing one or more aspects of the invention.

FIG. 11 illustrates a cross-sectional view of a light emitting device 15 according to a fifth exemplary embodiment employing one or more aspects of the invention.

Referring to FIG. 11, the light emitting device 15 may substantially correspond to the light emitting device described above, e.g., 11 of FIG. 1, but including the light emitting element 500 of FIG. 8. More particularly, the light emitting elements 500 may be flipped over the base substrate 309 and first, second and third electrodes 540, 551, 552 may be electrically connected to the base substrate 309 via conductive resin, e.g., solder bumps 335. For example, the first electrode 540 may be electrically connected to the respective first patterns 310_1 via a respective one of the solder bumps 335, the second and third electrodes 551, 552 may be electrically connected to the respective second patterns 320_1 to 320_*n*+1 via respective ones of the solder bumps 335. More particularly, when the light emitting element 500 is flipped over the circuit 301, the first electrode 540 may at least partially overlap the respective first pattern 310_1 to 310_*n* and the respective solder bump 335 may be therebetween, the second electrode 551 may at least partially overlap the respective portion of the second pattern 320_1 to 320_*n*+1 and the respective solder bump 335 may be therebetween, and the third electrode 552 may at least partially overlap the respective portion of the second pattern 320_1 to 320_*n*+1 and the respective solder bump 335 may be therebetween.

Figure 12:
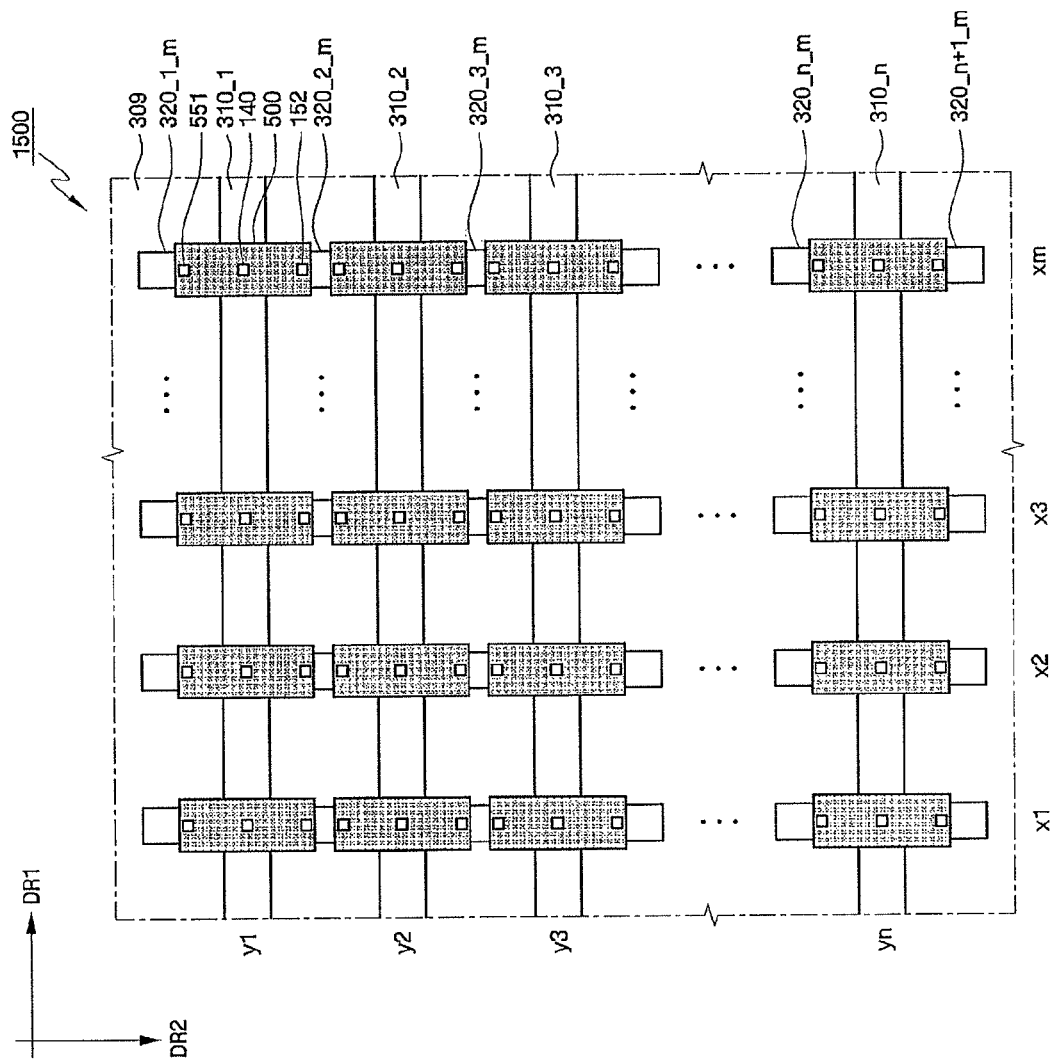
FIG. 12 illustrates an exemplary schematic diagram of first and second conductive patterns and first, second and third electrodes employable with the light emitting device of FIG. 11.

FIG. 12 illustrates an exemplary schematic diagram of first and second conductive patterns 310_1 to 310_*n* and 320_1 to 320_*n*+1 and first, second and third electrodes 540, 551, 552 of a light emitting apparatus 1500 including a plurality of the light emitting devices 15 of FIG. 11.

Referring to FIG. 12, the exemplary light emitting apparatus 1500 of FIG. 12 substantially corresponds to the exemplary light emitting apparatus 1100 of FIG. 3, but including the light emitting devices 500 of FIG. 11 instead of the light emitting elements 100 of FIG. 1. Accordingly, in the exemplary light emitting apparatus 1500 of FIG. 12, no wires may be employed to electrically connect the first, second and third electrodes 540, 551, 552 to the respective first or second patterns 310_1 to 310_*n* or 320_*n* to 320_*n*+1. It should be understood that the schematic diagram of FIG. 12 is merely intended to illustrate an exemplary arrangement of the electrodes 540, 551, 552 and patterns 310_1 to 310_*n* and 320_*n* to 320_*n*+1, and not as a view of the apparatus. That is, e.g., the electrodes 540, 551, 552 may not be visible from a top view of the apparatus 15. Further, the first patterns 310_1 to 310_*n* may be electrically separated from the second patterns 320_1 to 320_*n*+1.

Figure 13:
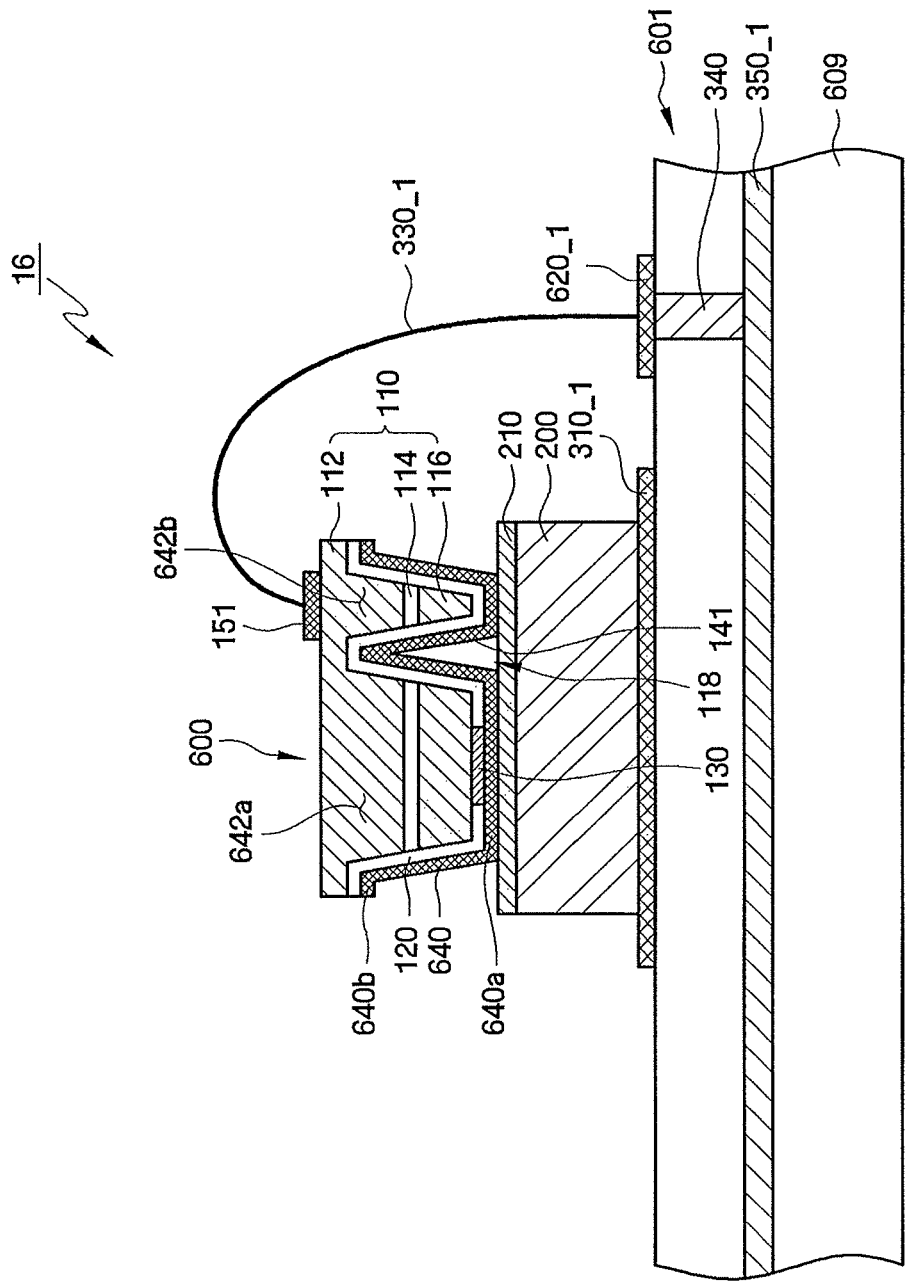
FIG. 13 illustrates a cross-sectional view of a light emitting device according to a sixth exemplary embodiment employing one or more aspects of the invention.

FIG. 13 illustrates a cross-sectional view of a light emitting device 16 according to a sixth exemplary embodiment employing one or more aspects of the invention. In general, only differences between the light emitting device 11 of FIG. 1 and the light emitting device 16 of FIG. 13 will be described below. In contrast to the light emitting element 100 of FIG. 1, the light emitting element 600 may not include the second electrode 152 and the wire 330_2.

Referring to FIG. 13, the light emitting device 16 may include a light emitting element 600, a base substrate 609, a second pattern 620_1, a via 340 and a third pattern 350_1. The second pattern 620_1 may be connected to the second electrode 151 via the wire 330_1. The second pattern 620_1 may be connected to the third pattern 350_1 by way of the via 340. That is, e.g., the second electrode 151 may be electrically connected with the third pattern 350_1 by way of the wire 330_1, the second pattern 320_1 and the via 340. The third pattern 350_1 may be on the base substrate 609. The third pattern 350_1 may extend below the light emitting element 600 on the base substrate 609. For example, the first pattern 310_1 and/or the second pattern 620_1 may extend at a second pattern level on the base substrate 609 and the third pattern 350_1 may extend at a first pattern level on the base substrate 609. The first pattern level may be different from, e.g., below, the second pattern level.

Referring to FIGS. 1 and 13, the light emitting element 600 may include a first electrode 640. The first electrode 640 may include a bottom portion 640*a* and side portions) 640*b*. The first electrode 640 may include a single protrusion 141 defining a single groove 118. The respective side portions 640b of the first electrode 640 may define cavities 642a, 642b. The cavity 642a may correspond to a light emitting region and the cavity 642b may correspond to a non-light emitting region.

FIG. 14 illustrates a cross-sectional view of a light emitting device 17 according to a seventh exemplary embodiment employing one or more aspects of the invention. In general, only differences between the light emitting device 17 of FIG. 14 and the light emitting devices 14 and 16 of FIGS. 8 and 13, respectively, will be described below.

Referring to FIG. 14, the light emitting device 17 may include a light emitting element 700. The light emitting element 700 may substantially correspond to the light emitting element 500 of FIG. 8. Instead of the third electrode 552 and the wire 330_2 of the light emitting apparatus 14 of FIG. 8, the light emitting device 17 may include the via 340 and the third pattern 350_1 of the light emitting device 16 FIG. 13.

Figure 15:
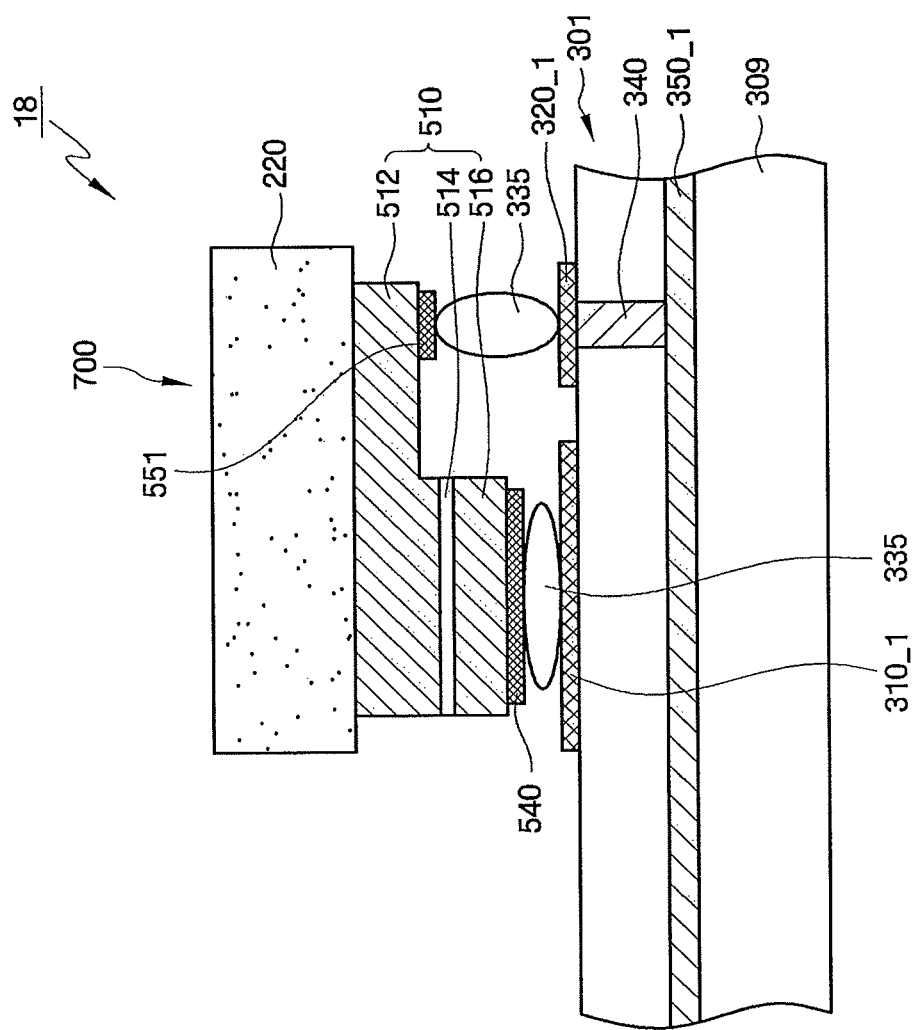
FIG. 15 illustrates a cross-sectional view of a light emitting device according to an eighth exemplary embodiment employing one or more aspects of the invention.

FIG. 15 illustrates a cross-sectional view of a light emitting device 18 according to an eighth exemplary embodiment employing one or more aspects of the invention. Referring to FIG. 15, the light emitting device 18 may substantially correspond to the light emitting device 17 of FIG. 14, with the light emitting element 700 arranged in flip-chip manner. That is, instead of employing wires 330_1, 330_3 to electrically connect the first electrode 540 and the second electrode 551 to the corresponding first pattern 310_1 and second pattern 320_1, respectively, the light emitting apparatus 18 may include the solder bumps 335 respectively connecting the first electrode 540 to the first pattern 310_1 and the second electrode 551 to the second pattern 320_1. In the light emitting apparatus 18, the second patterns 320_1 may be electrically connected to the respective third pattern 350_1 by way of the via 340.

Figure 16:
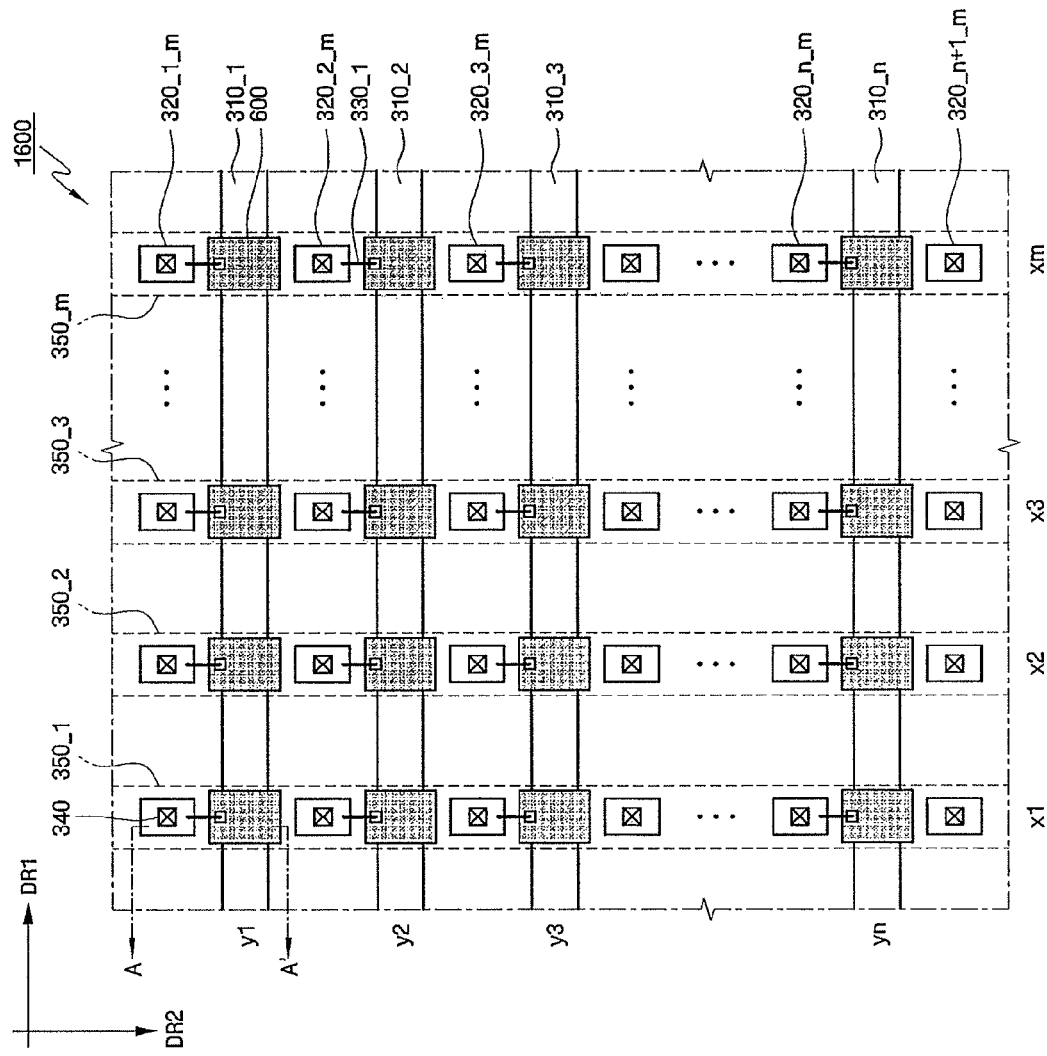
FIG. 16 illustrates a schematic diagram of an exemplary arrangement of the first, second and third patterns employable with the light emitting device of FIG. 13.

FIG. 16 illustrates a schematic diagram of an exemplary arrangement of the first patterns 310_1 to 310_n, the second patterns 320_1 the third patterns 350_1 to 350_m in a light emitting apparatus 1600 including a plurality of the light emitting devices 600 of FIG. 13. The exemplary arrangement of FIG. 16 may substantially correspond to the exemplary arrangement of FIG. 3, including the third patterns 350_1 to 350_m. The third patterns 350_1 to 350_m may extend along a direction crossing a direction along which the first patterns 310_1 to 310_n extend, e.g., may extend along the second direction DR2. The third patterns 350_1 to 350_m may have a striped-type pattern. Respective ones of the third patterns 350_1 to 350_m may extend parallel to each other. The third patterns 350_1 to 350_m may extend below the respective light emitting elements, e.g., 600. The third patterns 350_1 to 350_m may define columns x1 to xm. The third patterns 350_1 to 350_m may partially and/or completely overlap with the respective light emitting elements 600. The third patterns 350_1 to 350_ may be electrically connected to the second patterns 320_1 to 320_n+1 via the respective vias 340.

In the exemplary embodiment of FIG. 16, e.g., the second electrode 151 (see FIG. 13) may be electrically connected to the respective second pattern 320_1 to 320_n+1 via the respective wire 330_1. Embodiments are not limited thereto. For example, the light emitting element 700 of FIGS. 14 and 15 may be employed in some embodiments. In embodiments employing the light emitting apparatus 17 of FIG. 14, e.g., the first electrode 540 may also be electrically connected to the respective first pattern 310_1 to 310_n via the respective wire 330_3. In embodiments employing the light emitting apparatus 18 of FIG. 15, e.g., the solder bumps 335 may be employed instead of the wires 330_1, 330_3. In such embodiments, similar to the exemplary embodiment of FIG. 12, respective portions of the light emitting element 700 may overlap with the respective first and/or second patterns 310_1 to 310_n and/or 320_1 to 320_n+1 to be electrically connected thereto via, e.g., the solder bumps 335. Although such exemplary modifications may not be illustrated in FIG. 16, it should be understood that such and other modifications are possible.

Figure 17:
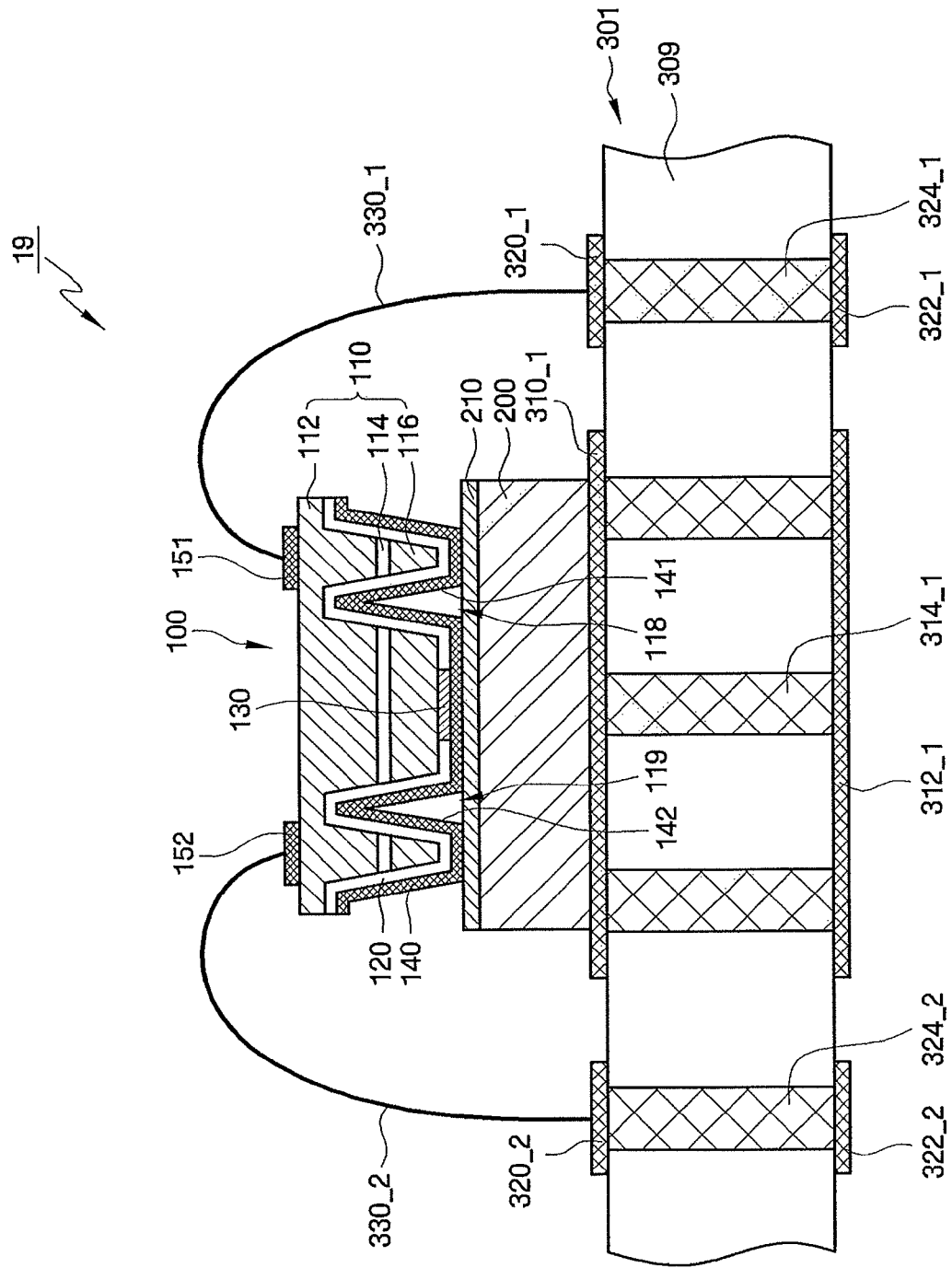
FIG. 17 illustrates a cross-sectional view of a light emitting device according to a ninth exemplary embodiment employing one or more aspects of the invention.

FIG. 17 illustrates a cross-sectional view of a light emitting device 19 according to a ninth exemplary embodiment employing one or more aspects of the invention. In general, only differences between the exemplary device 11 of FIG. 1 and the exemplary device 19 of FIG. 17 will be described below.

Referring to FIG. 17, the light emitting device 19 may include third pattern(s) 312_1 and fourth pattern(s) 322_2. The first pattern(s) 310_1 may be electrically connected to respective third patterns) 312_1 by way of via(s) 314_1. The second patterns) 320_1, 320_2 may be connected to respective fourth pattern(s) 322_1, 322_2, respectively. In such embodiments, e.g., the first pattern(s), e.g., 310_1 to 310_n, and the second pattern(s), e.g., 320_1 to 320_n+1, may be electrically connected to patterns on a plurality of sides, e.g., two sides, e.g., front and back sides, of the base substrate 309. While a single or a plurality of vias, e.g., 314_1, 324_1, 324_2, may be illustrated as electrically connecting the first pattern 310_1 and/or the second pattern 320_1, 320_2 to the respective third pattern 312_1 and/or the fourth pattern 322_1, 322_2, embodiments are not limited thereto, as more and/or less vias may be employed.

Figure 18:
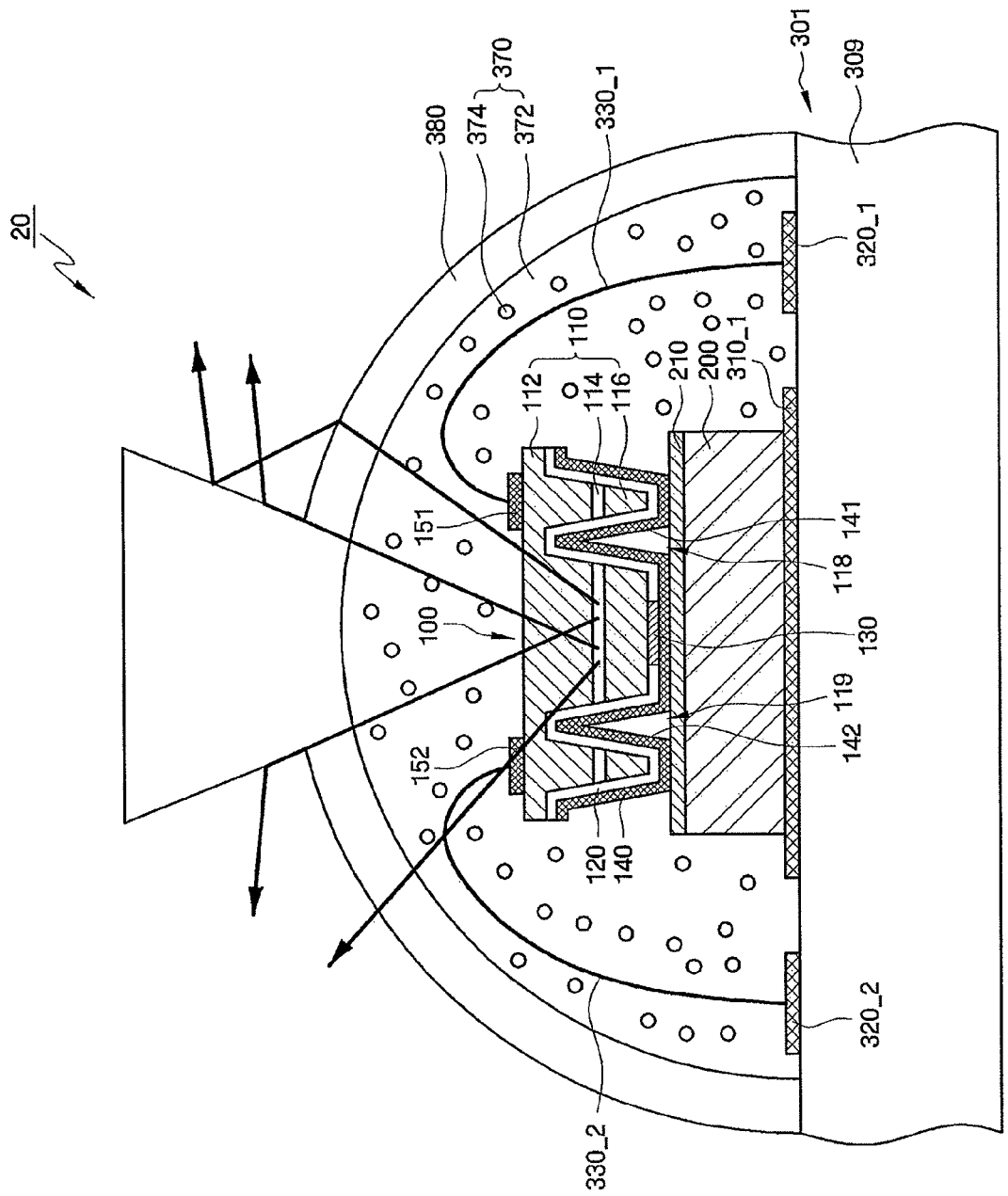
FIG. 18 illustrates an exemplary arrangement of phosphor employable by a light emitting device.
Figure 19:
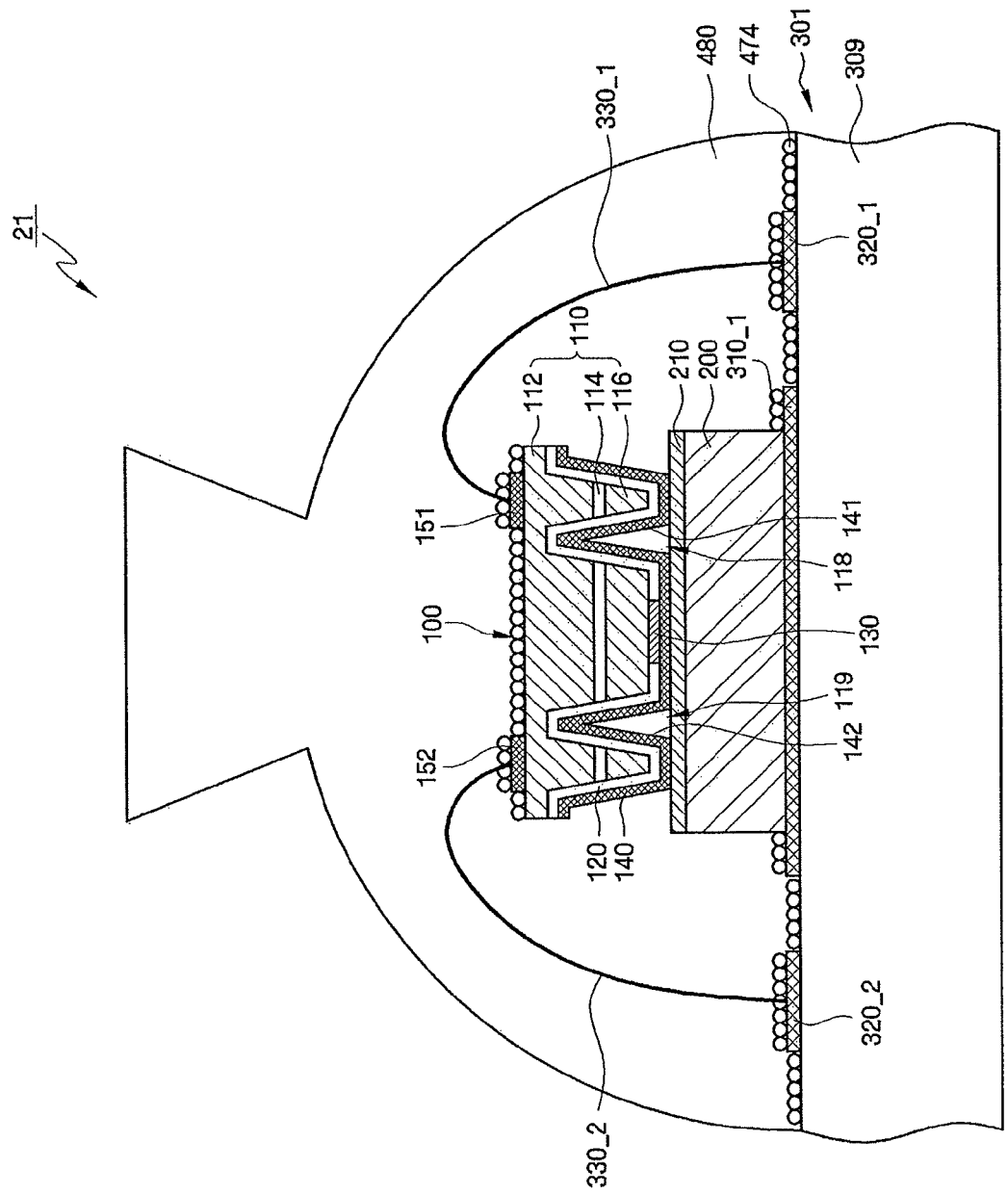
FIG. 19 illustrates a second exemplary arrangement of phosphor employable by a light emitting device.

FIG. 18 illustrates an exemplary arrangement of phosphor employable by a light emitting device 20. FIG. 19 illustrates a second exemplary arrangement of phosphor employable by a light emitting device 21.

Referring to FIGS. 18 and 19, the light emitting devices 20, 21 may substantially correspond to the light emitting device 11 of FIG. 1. It should be understood that while the light emitting device 11 of FIG. 1 is illustrated in the exemplary embodiments of FIGS. 19 and 20, features of phosphor described herein may be applied to any light emitting device, e.g., 12, 13, 14, 15, 16, 17, 18, etc., including one or more aspects of the invention.

Referring to FIG. 18, the light emitting device 20 may include a phosphor layer 370 and a second transparent resin 380. The phosphor layer 370 may include a first transparent resin 372 and phosphor 374. The phosphor 374 may be dispersed in the phosphor layer 370. More particularly, the phosphor 374 may be dispersed on and/or within the first transparent resin 374. The phosphor layer 370 may be formed over the light emitting element 100. For example, the phosphor layer 370 may completely cover the light emitting element 100 on the circuit board 301. The second transparent resin 380 may completely cover the phosphor layer 370 on the circuit board 301. The second transparent resin 380 may include a lens shape. The second transparent resin 350 may diffuse light generated by the light emitting element 100. The phosphor layer 370 and the circuit board 301 may together substantially encapsulate the light emitting element 100.

Referring to FIG. 18, the phosphor 374 may be dispersed within the transparent resin 372. The phosphor 374 may absorb light generated by the emitting element 100 and may convert the light to light of a different wavelength, e.g., different color. The phosphor 374 may include, e.g., nitride-based and/or oxide-based material that may be activated by lanthanide(s), e.g., Eu, Ce, etc.

Referring to FIG. 19, in some other exemplary embodiments, e.g., the light emitting device 21 may include phosphor 474 on the light emitting element 100, e.g., directly on the second electrode 151, the base substrate 309, the first pattern 320_1, 320_2, etc. More particularly, e.g., the phosphor 474 may be directly and conformally on the light emitting element 100, i.e., along a profile of the light emitting element 100 and/or the circuit board 301. A transparent resin 480 may be formed over the phosphor 474 and the light emitting element 100.

While exemplary phosphor arrangements are illustrated in FIGS. 18 and 19, it should be understood that embodiments are not limited thereto and other phosphor arrangements may be employed. For example, in some embodiments, a transparent resin may be formed on a light emitting element, e.g., 100, and phosphor may be arranged between that transparent resin and another transparent resin arranged on the phosphor.

FIGS. 20A and 20B illustrate exemplary arrangements of the phosphor layer 370 and the second transparent resin 380 of FIG. 18. In some embodiments, the phosphor layer 370 and the second transparent resin 380 may be line-type and/or dot-type, etc. More particularly, referring to the exemplary embodiment of FIG. 20A, in the line-type manner, a single strip of the phosphor layer 370 and the second transparent resin 350 may overlap a plurality of the light emitting elements 100. In such embodiments, the light emitting elements, e.g., 100 of FIG. 1, may be arranged, e.g., in a matrix manner. Referring to FIG. 20B, in the dot-type manner, e.g., each portion of the phosphor layer 370 and the second transparent resin 380 may overlap a single one of the light emitting elements 100.

It is understood that while the exemplary light emitting element 100 of FIG. 1 is illustrated in FIGS. 20A and 20B, embodiments are not limited thereto, as other light emitting elements, e.g., 200, 400, 500, 600 of FIGS. 6, 7, 13, 14, respectively, may be employed. Further, while the exemplary phosphor layer 370 and second transparent resin 380 of FIG. 18 is illustrated in FIGS. 20A and 20B, embodiments are not limited thereto. For example, the exemplary phosphor 474 and transparent resin 480 of FIG. 19 may be arranged in the dot-type and/or line-type manner of FIGS. 20A and 20B.

Figure 21:
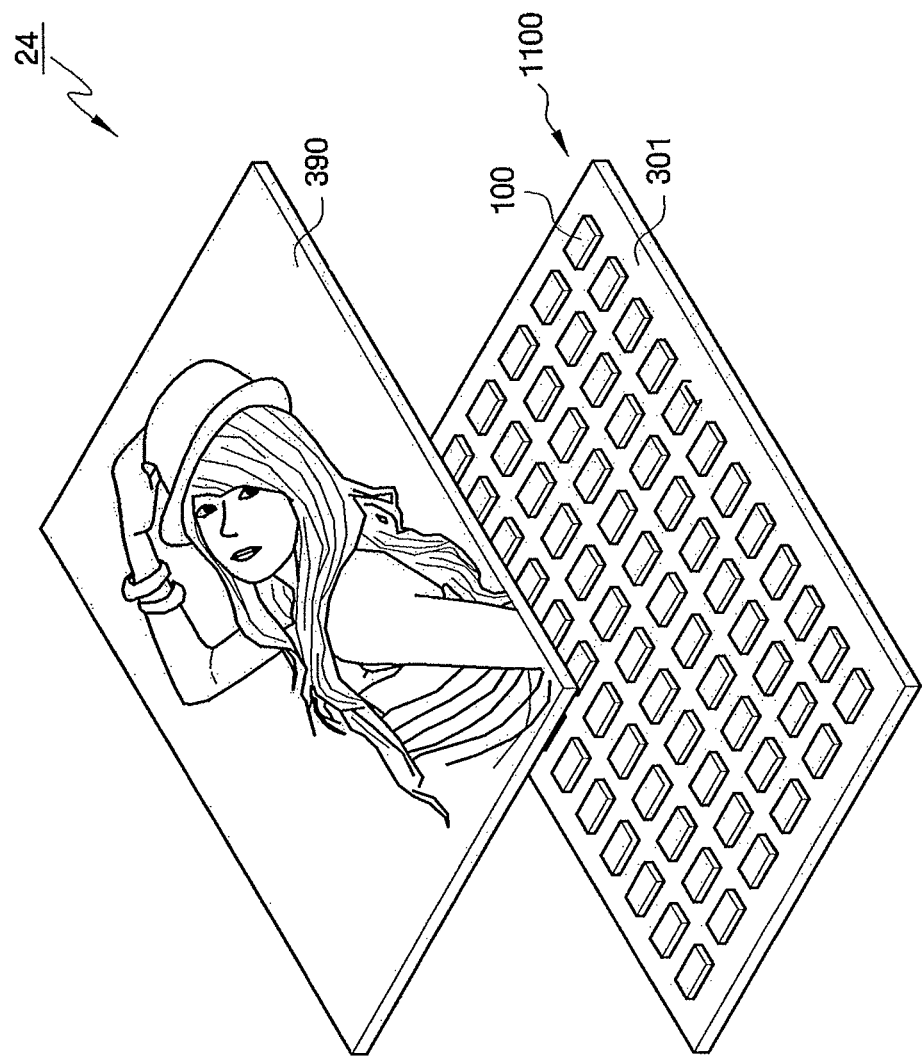
FIG. 21 illustrates a diagram of a portion of an exemplary display device employing the light emitting device of FIG. 1.

FIG. 21 illustrates a diagram of a portion of an exemplary display device 24 employing the light emitting apparatus 1100 of FIG. 3. More particularly, referring to FIG. 21, the light emitting apparatus 1100 of FIG. 3 may be employed together with a liquid crystal panel 390 to provide the display device 24. While the display device 24 is illustrated in FIG. 21 as an exemplary device that may employ a light emitting element according to one or more aspects of the invention, it should be understood that applications of embodiments described herein are not limited thereto. For example, light emitting elements employing one or more features described herein may be employed in, e.g., digital clocks, remote controls, watches, calculators, cell phones, indicator lights, backlights, etc.

FIGS. 22A, 22B, 22C, 22D, 22E, 22F, 22G and 22H illustrate stages in an exemplary method for fabricating the exemplary light emitting element 100 of FIG. 1.

Referring to FIG. 22A, to fabricate the light emitting element 100 of FIG. 1, a first conductive layer 112*a*, an emitting layer 114*a* and a second conductive layer 116*a* may be successively formed on a substrate 900. The first conductive layer 112*a*, the emitting layer 114*a* and the second conductive layer 116*a* may be formed using, e.g., metal organic chemical vapor deposition (MOCVD), liquid phase epitaxy, hydride vapor phase epitaxy, molecular beam epitaxy and/or metal organic vapor phase epitaxy, etc. By forming the second block pattern 106, the buffer layer 104 may be used as a seed layer and the first conductive layer 112*a*, the emitting layer 114*a* and the second conductive layer 116*a* may be formed using, e.g., lateral epitaxial overgrowth (LEO).

Referring to FIG. 22B, the emitting structure 110 may be formed by etching. That is, the first conductive layer 112*a*, the emitting layer 114*a* and/or the second conductive layer 116*a* may be etched to respectively form the first conductive pattern 112, the emitting pattern 114 and the second conductive pattern 116. In some embodiments, the emitting structure 110 may include sloped sides. More particularly, as shown in FIG. 22B, in some embodiments, the structure shown in FIG. 22A may be etched such that a base portion of the remaining protruding structure(s) is wider than an upper portion thereof, i.e., a width of the groove 118 decreases towards a base of the groove 118.

Referring to FIG. 22C, an insulating layer may be formed on the emitting structure 110 and patterned to form the insulation layer 120. More particularly, e.g., the insulation layer 120 may be conformally formed on a profile of the emitting structure 110. Further, referring to FIG. 22C, portions of the insulating layer, e.g., upper portions of the insulating layer on an upper surface of the second conductive pattern 116, may be patterned to form the insulation layer 120 and to expose respective portions of the second conductive pattern 116.

Referring to FIG. 22D, the ohmic layer 130 may be formed over the second conductive pattern 116. More particularly, the ohmic layer 130 may fill gap(s) that may include resulted from the patterning of the insulation layer 120. The first electrode 140 may be formed on the insulation layer 120 and/or the ohmic layer 130.

Figure 22E:
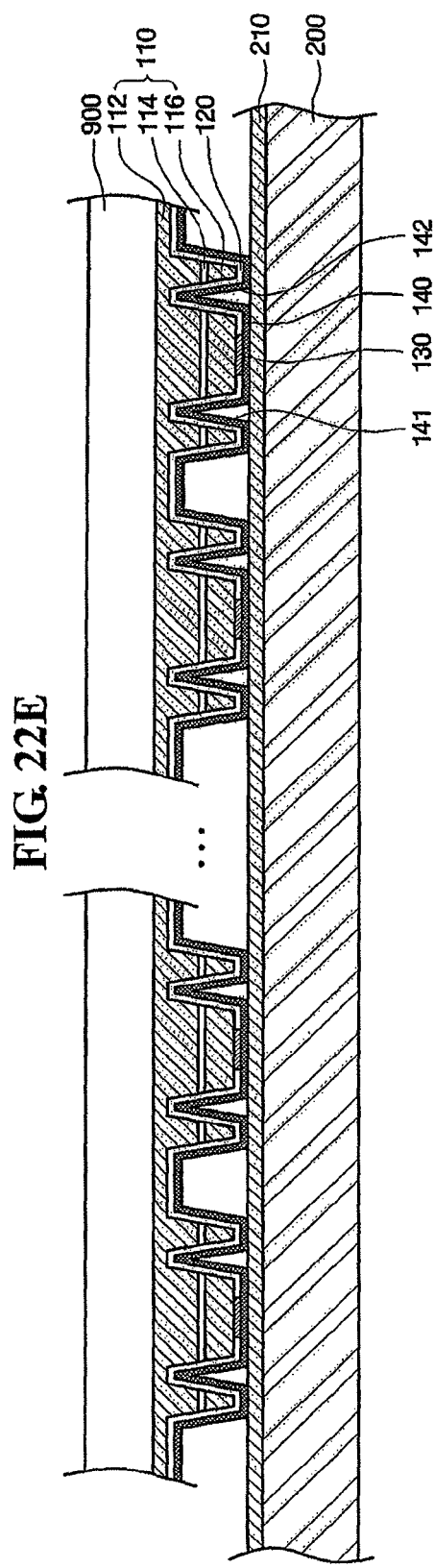
Figure 22F:
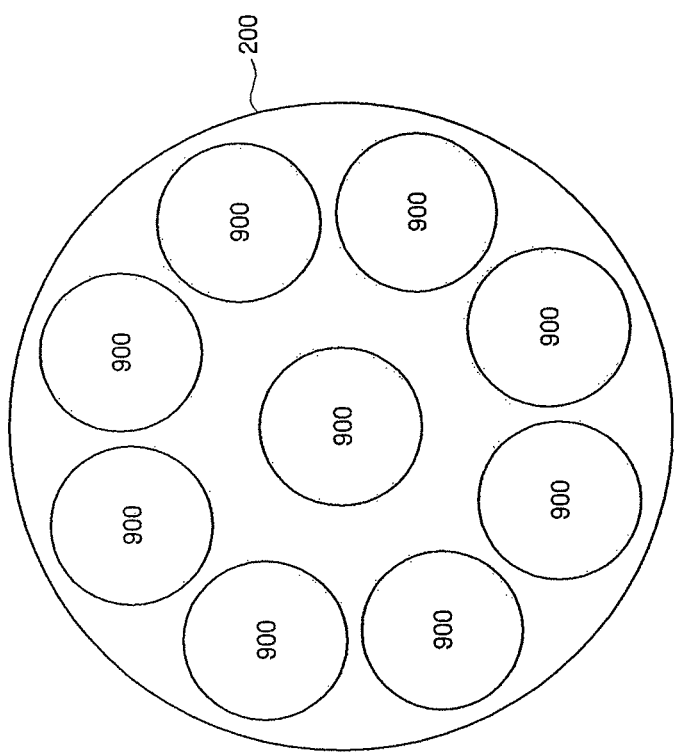

Referring to FIG. 22E, a plurality of the resulting structures of FIG. 22D may be bonded on the conductive substrate 200. For example, as shown in FIG. 22E, the resulting structure of FIG. 22D may be inverted and bonded to the conductive substrate 200. More particularly, a plurality of the resulting structures of FIG. 22D may be inverted and bonded on the intermediate layer 210 on the substrate 200, as shown in FIG. 22F.

Figure 22G:
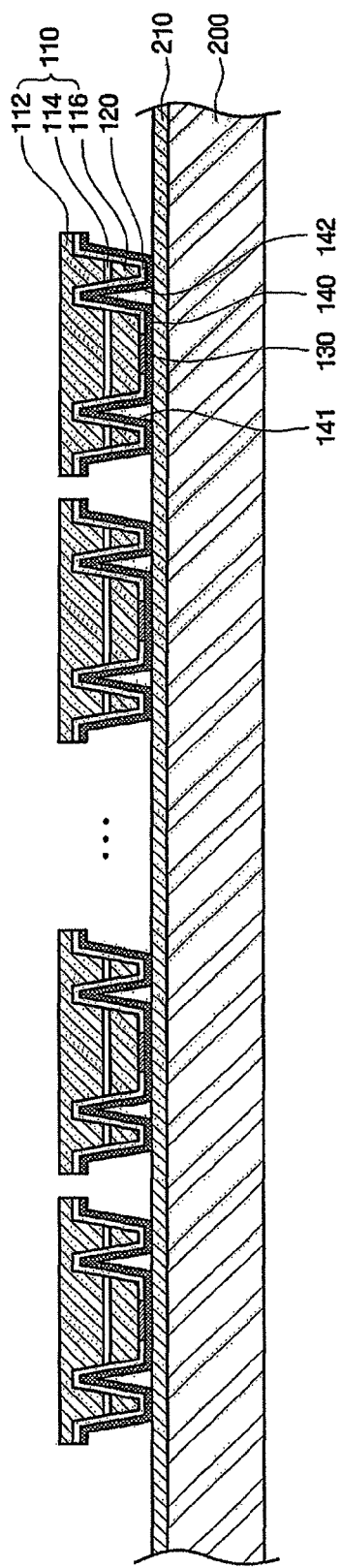
Figure 22H:
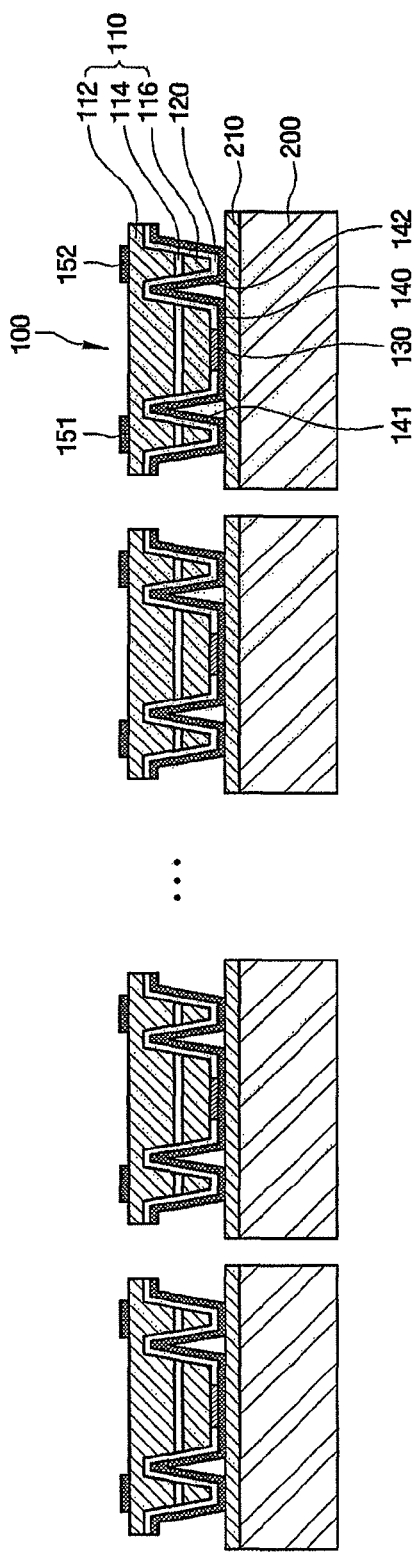

Referring to FIG. 22G, e.g., LLO may be used to remove the substrate 900. As shown in FIG. 19H, the first conductive pattern 112 may be exposed as a result of removing the substrate 900. Referring to FIG. 22H, the second electrode 151 and the third electrode 152 may be formed on the first conductive pattern 112. Sawing may then be performed to separate the light emitting elements 100 from each other. Sawing may then be performed to separate the light emitting elements 100 from each other.

To obtain the resulting structures illustrates in, e.g., FIGS. 3, 9, 10, 12 and 16, the light emitting elements may then be arranged on a substrate including, e.g., first patterns and second patterns according to one or more of the features described above. Respective ones of the first electrodes may be connected to corresponding ones of the first patterns and respective ones of the second and/or third electrodes may be connected to corresponding ones of the second patterns by way of, e.g., a wire, a conductive substrate and/or resin. Further, phosphor layers may be formed over the light emitting elements, e.g., 100, 200, 300, 400, 500, 600, 700, to obtain, e.g., the structures illustrated in FIGS. 20A, 20B.

Exemplary embodiments of the present invention include been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A light emitting element comprising:
   a base substrate;
   a conductive substrate on the base substrate;
   an intermediate layer on the conductive substrate;
   a first electrode on the intermediate layer, the first electrode including a bottom portion and side portions;
   a second electrode;
   a pattern on the base substrate and arranged on a side of the conductive substrate; and
   a wire or a conductive resin that electrically connects the pattern to the second electrode,
   wherein the bottom portion conforms to a shape of the intermediate layer and/or the conductive substrate and the side portions extend along a direction that crosses a plane along which the bottom portion of the first electrode extends,
   wherein adjacent or corresponding ones of side portions together define at least one protrusion in the first electrode,
   wherein the first electrode includes the at least one protrusion defining a groove between the first electrode and the conductive substrate,
   wherein the at least one protrusion defines at least one light emitting region and at least one non-light emitting region adjacent to each other on the first electrode, and
   wherein the second electrode overlaps a non-light emitting region and does not overlap a light emitting region.

2. The light emitting element as claimed in claim 1, wherein the conductive substrate includes at least one of Si, strained Si, Si alloy, SOI, SiC, SiGe, SiGeC, Ge, Ge alloy, GaAs, InAs, III-V semiconductor, or II-VI semiconductor.

3. The light emitting element as claimed in claim 1, wherein the intermediate layer connects the first electrode to the conductive substrate and includes at least one of Au, Ag, Pt, Ni, Cu, Sn, Al, Pb, Cr, Ti, or W.

4. The light emitting element as claimed in claim 1, wherein the first electrode includes a reflective material.

5. The light emitting element as claimed in claim 1, wherein the first electrode includes at least one of Ag and Al.

6. The light emitting element as claimed in claim 1, wherein the bottom portion extends substantially along a plane parallel to the intermediate layer, the bottom portion having a non-overlapping relationship with the protrusion.

7. The light emitting element as claimed in claim 1, wherein the side portions of the first electrode generally extend at an angle of greater than 90° relative to the bottom portion.

8. The light emitting element as claimed in claim 1, further comprising a circuit board disposed under the conductive substrate, and a phosphor layer formed over the light emitting element, and a second transparent resin on the phosphor layer.

9. The light emitting element as claimed in claim 8, wherein the phosphor layer includes a first transparent resin and phosphor, the phosphor layer contacting the substrate.

10. The light emitting element as claimed in claim 9, wherein the phosphor includes at least one of nitride-based and oxide-based material activated by a lanthanide.

11. The light emitting element as claimed in claim 9, wherein the phosphor is directly and conformally on the light emitting element along a profile of the light emitting element and/or the circuit board.

12. The light emitting element as claimed in claim 8, wherein the phosphor layer completely covers the light emitting element.

13. The light emitting element as claimed in claim 8, wherein the second transparent resin completely covers the phosphor layer on the circuit board.

14. The light emitting element as claimed in claim 8, wherein the second transparent resin includes a lens shape.

15. The light emitting element as claimed in claim 1, wherein the adjacent or corresponding ones of the side portions of the first electrode extend away from the bottom portion to directly contact each other and to define the at least one protrusion, an empty space being between a contact point of the side portions and the intermediate layer defining the groove.

16. The light emitting element as claimed in claim 1, wherein the groove is between a bottom surface of the first electrode and a top surface of the substrate, a width of the groove increasing toward the intermediate layer.

17. The light emitting element as claimed in claim 1, wherein:
   each side portion of the first electrode has first and second surfaces opposite each other and defining a predetermined thickness of a respective side portion,
   the bottom portion of the first electrode has third and fourth surfaces opposite each other and defining a predetermined thickness of the bottom portion, the thicknesses of the side and bottom portions being equal to each other and defining a thickness of the first electrode, and
   the side and bottom portions define a bent first electrode, such that at least one cavity is defined above the bottom portion and between corresponding side portions.

18. The light emitting element as claimed in claim 1, further comprising:
   an insulating layer on the first electrode;
   a second conductive pattern on the insulating layer;
   an emitting pattern on the second conductive pattern; and
   a first conductive pattern on the emitting pattern,
   the second electrode being on the first conductive pattern and overlapping a non-light emitting region of the light emitting element, the side and bottom portions of the first electrode defining at least one cavity, and the emitting pattern being inside the at least one cavity.

19. The light emitting element as claimed in claim 18, wherein the protrusion defines at least two cavities on the first electrode, a narrow edge of the protrusion extending above the emitting pattern relative to the bottom portion of the first electrode.

* * * * *